US012750960B2

(12) United States Patent
Yoon et al.

(10) Patent No.: US 12,750,960 B2
(45) Date of Patent: Sep. 29, 2026

(54) ROLLABLE ELECTRONIC DEVICE COMPRISING GUIDE ASSEMBLY

(71) Applicant: Samsung Electronics Co., Ltd., Suwon-si (KR)

(72) Inventors: Yeonggyu Yoon, Suwon-si (KR); Youngmin Kang, Suwon-si (KR); Moonchul Shin, Suwon-si (KR); Joongyeon Cho, Suwon-si (KR); Junyoung Choi, Suwon-si (KR); Wonho Shin, Suwon-si (KR); Byounguk Yoon, Suwon-si (KR); Junghyeob Lee, Suwon-si (KR); Sunggun Cho, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 85 days.

(21) Appl. No.: 18/821,487

(22) Filed: Aug. 30, 2024

(65) Prior Publication Data

US 2024/0431048 A1 Dec. 26, 2024

Related U.S. Application Data

(63) Continuation of application No. PCT/KR2023/002733, filed on Feb. 27, 2023.

(30) Foreign Application Priority Data

Mar. 7, 2022 (KR) ........................ 10-2022-0028858
Jun. 22, 2022 (KR) ........................ 10-2022-0076247

(51) Int. Cl.
*H05K 5/02* (2006.01)

(52) U.S. Cl.
CPC .................................. *H05K 5/0217* (2013.01)

(58) Field of Classification Search
CPC .............. H05K 5/0217; H04M 1/0235; H04M 1/0237; H04M 1/0268; G09F 9/301
See application file for complete search history.

(56) References Cited

U.S. PATENT DOCUMENTS

| | | | |
|---|---|---|---|
| 10,742,784 | B1 | 8/2020 | Jo et al. |
| 10,747,269 | B1 | 8/2020 | Choi et al. |

(Continued)

FOREIGN PATENT DOCUMENTS

| | | |
|---|---|---|
| CN | 112351124 A | 2/2021 |
| CN | 214154309 U | 9/2021 |

(Continued)

OTHER PUBLICATIONS

European Search Report dated Apr. 28, 2025, issued in European Application No. 23767072.4.

(Continued)

*Primary Examiner* — Allen L Parker
*Assistant Examiner* — Peter Krim
(74) *Attorney, Agent, or Firm* — Jefferson IP Law, LLP

(57) ABSTRACT

An electronic device is be provided. The electronic device includes a first housing, a second housing configured to slidably move relative to the first housing, a rollable display configured to be unrolled or rolled based on a slide movement of the second housing, a multi-bar structure supporting the rollable display, and attached to at least a portion of the rollable display, and a guide assembly configured to guide the slide movement of the second housing, wherein the guide assembly includes a rail structure connected to the second housing, and a rail receiving part including a first surface, in which a first slit receiving at least a portion of the multi-bar structure is formed, and a second surface opposite to the first surface and receiving at least a portion of the rail (Continued)

structure, and wherein the rail structure is configured to slide with respect to the rail receiving portion.

15 Claims, 32 Drawing Sheets

(56) References Cited

U.S. PATENT DOCUMENTS

| | | | | |
|---|---|---|---|---|
| 11,315,447 | B2 * | 4/2022 | Feng | G06F 1/1652 |
| 11,917,777 | B2 * | 2/2024 | Hong | H05K 5/0217 |
| 2020/0264660 | A1 * | 8/2020 | Song | H04M 1/0237 |
| 2020/0267247 | A1 | 8/2020 | Song et al. | |
| 2021/0044683 | A1 * | 2/2021 | He | G06F 1/1652 |
| 2021/0099557 | A1 | 4/2021 | Cha et al. | |
| 2021/0126993 | A1 | 4/2021 | Baek et al. | |
| 2021/0181800 | A1 | 6/2021 | Ko et al. | |
| 2021/0185834 | A1 | 6/2021 | Choi et al. | |
| 2021/0278886 | A1 | 9/2021 | Kim et al. | |
| 2021/0405703 | A1 * | 12/2021 | Song | G06F 1/1694 |
| 2022/0100236 | A1 | 3/2022 | Kwak et al. | |
| 2022/0342448 | A1 | 10/2022 | Shin et al. | |
| 2023/0103303 | A1 | 4/2023 | Kang et al. | |
| 2023/0130358 | A1 | 4/2023 | Choi et al. | |
| 2024/0267444 | A1 * | 8/2024 | Kim | H04B 1/44 |

FOREIGN PATENT DOCUMENTS

| | | | |
|---|---|---|---|
| CN | 113808490 | A | 12/2021 |
| EP | 3 907 580 | A1 | 11/2021 |
| KR | 10-1462791 | B1 | 11/2014 |
| KR | 10-2016-0141255 | A | 12/2016 |
| KR | 10-2020-0124989 | A | 11/2020 |
| KR | 10-2021-0031348 | A | 3/2021 |
| KR | 10-2021-0076492 | A | 6/2021 |
| KR | 10-2021-0080309 | A | 6/2021 |
| KR | 10-2290231 | B1 | 8/2021 |
| KR | 10-2021-0148396 | A | 12/2021 |
| KR | 10-2022-0008738 | A | 1/2022 |
| WO | 2021/167236 | A1 | 8/2021 |
| WO | 2021/246660 | A1 | 12/2021 |
| WO | 2022/015048 | A1 | 1/2022 |

OTHER PUBLICATIONS

International Search Report dated May 26, 2023, issued in International Application No. PCT/KR2023/002733.

* cited by examiner

ROLLABLE ELECTRONIC DEVICE COMPRISING GUIDE ASSEMBLY

CROSS-REFERENCE TO RELATED APPLICATION(S)

This application is a continuation application, claiming priority under § 365(c), of an International application No. PCT/KR2023/002733, filed on Feb. 27, 2023, which is based on and claims the benefit of a Korean patent application number 10-2022-0028858, filed on Mar. 7, 2022, in the Korean Intellectual Property Office, and of a Korean patent application number 10-2022-0076247, filed on Jun. 22, 2022, in the Korean Intellectual Property Office, the disclosure of each of which is incorporated by reference herein in its entirety.

BACKGROUND

1. Field

The disclosure relates to a rollable electronic device including a guide assembly.

2. Description of Related Art

With the development of information and communication technology and semiconductor technology, various functions are packed in one portable electronic device. For example, an electronic device may implement not only communication functions but also entertainment functions, such as playing games, multimedia functions, such as playing music and videos, communication and security functions for mobile banking, and scheduling and e-wallet functions. These electronic devices have been downsized to be conveniently carried by users.

As mobile communication services extend up to multimedia service sectors, electronic devices require a larger display to allow users satisfactory use of multimedia services as well as voice call or text messaging services. However, the display size of the electronic device may be in a trade-off relationship with downsizing the electronic device.

The above information is presented as background information only to assist with an understanding of the disclosure. No determination has been made, and no assertion is made, as to whether any of the above might be applicable as prior art with regard to the disclosure.

SUMMARY

An electronic device (e.g., a portable terminal) may include a display having a flat surface or having a flat surface and a curved surface. An electronic device including a display may be limited in implementing a screen larger than the size of the electronic device due to the structure of the fixed display. Accordingly, research has been conducted on electronic devices including a rollable display.

When the rollable display is rolled up or unrolled, the different housings of the electronic device may move relative to each other. However, when the electronic device includes a guide rail for guiding the movement of the display and a linear motion guide member for moving the housing, a plurality of components may be used, thereby reducing the inner space of the electronic device.

Aspects of the disclosure are to address at least the above-mentioned problems and/or disadvantages and to provide at least the advantages described below. Accordingly, an aspect of the disclosure is to provide an electronic device including a guide assembly capable of guiding a relative movement of a housing while guiding the movement of a display.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing configured to slide relative to the first housing, a rollable display configured to be unrolled or rolled based on a slide movement of the second housing, a multi-bar structure supporting the rollable display, and attached to at least a portion of the rollable display, and a guide assembly configured to guide the slide movement of the second housing, wherein the guide assembly includes a rail structure connected to the second housing, and a rail receiving part including a first surface, in which a first slit receiving at least a portion of the multi-bar structure is formed, and a second surface opposite to the first surface and receiving at least a portion of the rail structure, and wherein the rail structure is configured to slide with respect to the rail receiving part.

In accordance with another aspect of the disclosure, an electronic device is provided. The electronic device includes a housing including a first housing and a second housing at least partially received in the first housing and configured to relatively move with respect to the first housing, a display configured to be unrolled based on a slide of the second housing, a multi-bar structure supporting the display, and a guide assembly including a guide member including a first surface, in which a first slit receiving at least a portion of the multi-bar structure is formed, and a second surface opposite to the first surface and having a second slit and a rail structure having at least a portion received in the second slit and configured to slide with respect to the guide member.

In accordance with another aspect of the disclosure, an electronic device is provided. The electronic device includes a first housing, a second housing at least partially received in the first housing and configured to relatively move with respect to the first housing, a display configured to be unrolled based on the movement of the second housing, a multi-bar structure supporting the display, and a guide assembly including a guide member connected to the first housing and a rail structure connected to the second housing. The guide member includes a first surface where a first slit for guiding a movement of the multi-bar structure is positioned and a second surface where a second slit for guiding movement of the rail structure is positioned, and opposite to the first surface.

In accordance with another aspect of the disclosure, an electronic device is provided. The electronic device includes a first housing including a frame receiving a battery and a first cover member surrounding at least a portion of the frame, a second housing including a second cover member receiving a circuit board and configured to slide with respect to the first housing, a display configured to be at least partially unrolled based on the slide of the second housing and including a first display area disposed on the second cover member and a second display area extending from the first display area and configured to move along the frame, a multi-bar structure supporting at least a portion of the display, and a guide assembly including a guide member for sliding the multi-bar structure and a rail structure for sliding the second housing. The guide member is connected to the frame, and the rail structure may be connected to the second cover member and is configured to slide with respect to the guide member while being at least partially received in the guide member.

According to various embodiments of the disclosure, an electronic device includes a guide assembly for guiding movement of a display and a housing. As one component guides the movement of the display and housing, the inner arrangement space of the electronic device is increased.

According to various embodiments of the disclosure, the electronic device includes a guide assembly electrically connecting an antenna to the housing. As the ground area is increased by the guide assembly, parasitic resonance of the antenna is reduced and antenna performance is enhanced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Figure 1:
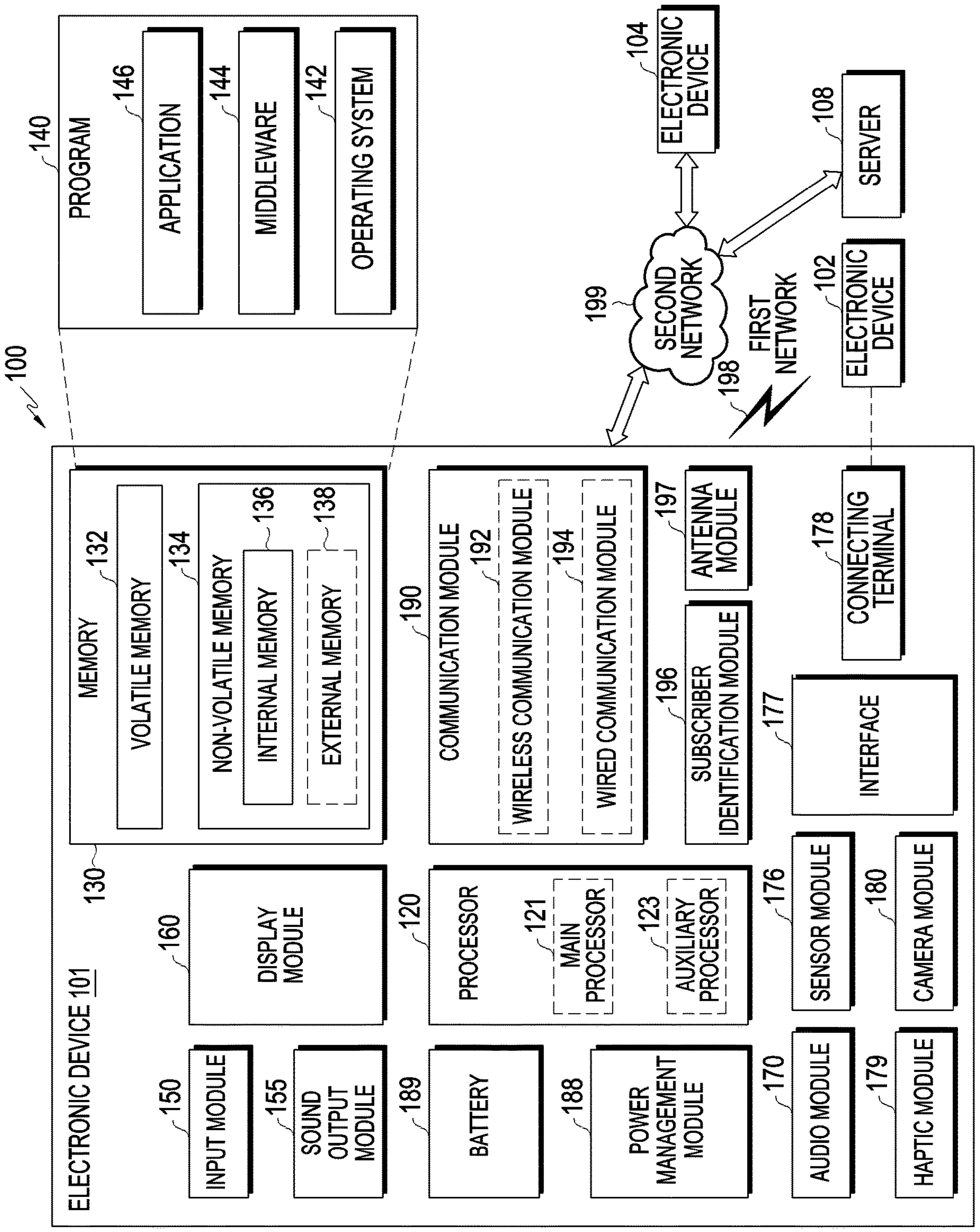
FIG. 1 is a block diagram illustrating an electronic device in a network environment according to an embodiment of the disclosure.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display driver integrated circuit (IC), an audio CODEC chip, a universal serial bus (USB) controller, a camera controller, an image processing IC, a microprocessor unit (MPU), a system on chip (SoC), an IC, or the like FIG. 1 is a block diagram illustrating an electronic device in a network environment according to an embodiment of the disclosure;

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a fifth generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, instructions or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
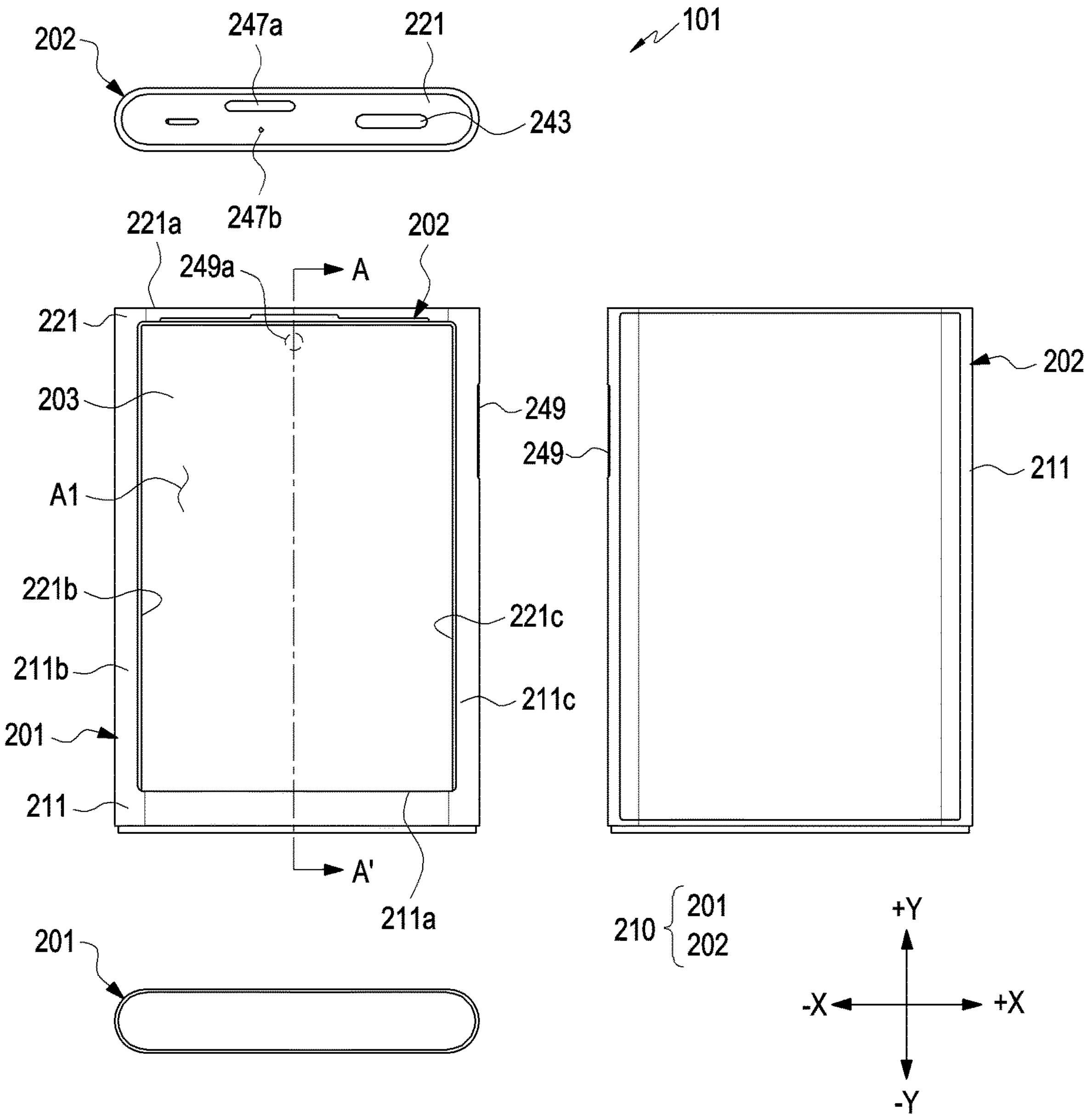
FIG. 2 is a view illustrating a state in which a second display area of a display is received in a housing according to an embodiment of the disclosure.

FIG. 2 is a view illustrating a state in which a second display area of a display is received in a housing according to an embodiment of the disclosure.

Figure 3:
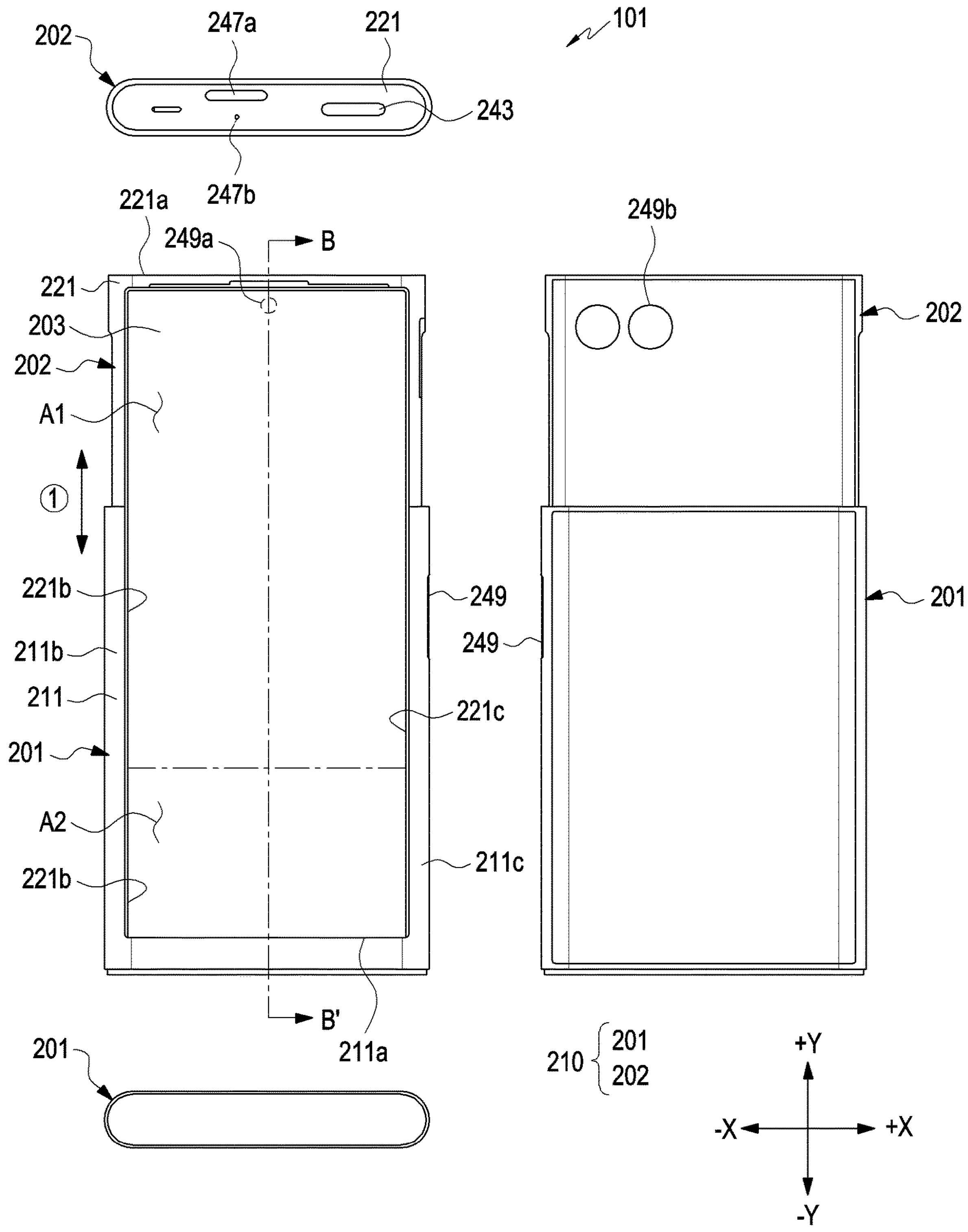
FIG. 3 is a view illustrating a state in which a second display area of a display is exposed to the outside of a housing according to an embodiment of the disclosure.

FIG. 3 is a view illustrating a state in which a second display area of a display is exposed to the outside of a housing according to an embodiment of the disclosure.

FIGS. 2 and 3 illustrate a structure in which the display 203 (e.g., flexible display) is extended in the upper direction (e.g., +Y direction) when the electronic device 101 is viewed from the front. However, the extending direction of the display 203 is not limited to one direction (e.g., +Y direction). For example, the extending direction of the display 203 may be changed in design to be extendable in the upper direction (+Y direction), right direction (e.g., +X direction), left direction (e.g., −X direction), and/or lower direction (e.g., −Y direction).

The state illustrated in FIG. 2 may be referred to as a slide-in state or a first state of the electronic device 101 or the housing 210. For example, the first state may be defined as a closed state of the second housing 202 with respect to the first housing 201.

The state illustrated in FIG. 3 may be referred to as a slide-out state or a second state of the electronic device 101 or the housing 210. For example, the second state may be defined as an open state of the second housing 202 with respect to the first housing 201. According to an embodiment, the "closed state" or "opened state" may be defined as a closed or opened state of the electronic device.

Referring to FIGS. 2 and 3, the electronic device 101 may include a housing 210. The housing 210 may include a first housing 202 and a second housing 202 disposed to be movable relative to the first housing 201. According to an embodiment, the electronic device 101 may be interpreted as having a structure in which the first housing 201 is disposed to be slidable with respect to the second housing 202. According to an embodiment, the second housing 202 may be disposed to perform reciprocating motion by a predetermined distance in a predetermined direction with respect to the first housing 201, for example, a direction indicated by an arrow ①.

According to various embodiments, the second housing 202 may be referred to as a second structure, a slide portion or a slide housing, and may be movable relative to the first housing 201. According to an embodiment, the second housing 202 may receive various electrical/electronic components, such as a circuit board or a battery.

According to an embodiment, the first housing 202 may have, disposed therein, a motor, a speaker, a sim socket, and/or a sub circuit board electrically connected with a main circuit board. The second housing 201 may receive a main circuit board on which electric components, such as an application processor (AP) and a communication processor (CP) are mounted.

According to various embodiments, the first housing 201 may include a first cover member 211 (e.g., a main case). The first cover member 211 may include a 1-1th sidewall 211*a*, a 1-2th sidewall 211*b* extending from the 1-1th sidewall 211*a*, and a 1-3th sidewall 211*c* extending from the 1-1th sidewall 211*a* and substantially parallel to the 1-2th sidewall 211*b*. According to an embodiment, the 1-2th sidewall 211*b* and the 1-3th sidewall 211*c* may be formed substantially perpendicular to the 1-1th sidewall 211*a*.

According to various embodiments, the 1-1th sidewall 211*a*, 1-2th sidewall 211*b*, and 1-3th sidewall 211*c* of the first cover member 211 may be formed to have a side opening (e.g., in the front surface) to receive at least a portion of the second housing 202. For example, at least a portion of the second housing 202 may be surrounded by the first housing 201 and be slid in the direction parallel to the first surface F1 or second surface F2, e.g., arrow ① direction, while being guided by the first housing 201. According to a specific embodiment, the 1-1th sidewall 211*a*, the 1-2th sidewall 211*b*, and/or the 1-3th sidewall 211*c* of the first cover member 211 may be integrally formed. According to a specific embodiment, the 1-1th sidewall 211*a*, the 1-2th sidewall 211*b*, and/or the 1-3th sidewall 211*c* of the first cover member 211 may be formed as separate structures and be combined or assembled.

According to various embodiments, the first cover member 211 may support at least a portion of the display 203. For example, at least a portion of the display 203 may be surrounded by the 1-1th sidewall 211*a*, the 1-2th sidewall 211*b*, and/or the 1-3th sidewall 211*c* of the first cover member 211. According to various embodiments, the second housing 202 may include a second cover member 221 (e.g., a slide plate). The second cover member 221 may include a first surface (e.g., the first surface F1 of FIG. 4) forming at least a portion of the second cover member 221. According to an embodiment, the second cover member 221 may support at least a portion of the display 203 (e.g., the first display area A1). According to an embodiment, the second cover member 221 may be referred to as a front cover.

According to an embodiment, the second cover member 221 may include a 2-1th sidewall 221*a*, a 2-2th sidewall 221*b* extending from the 2-1th sidewall 221*a*, and a 2-3th sidewall 221*c* extending from the 2-1th sidewall 221*a* and substantially parallel to the 2-2th sidewall 221*b*. According to an embodiment, the 2-2th sidewall 221*b* and the 2-3th sidewall 221*c* may be formed substantially perpendicular to the 2-1th sidewall 221*a*.

According to various embodiments, the second housing 202 may move in an open state or closed state with respect to the first housing 201 in a first direction (e.g., direction ① parallel to the 1-2th sidewall 211*b* or the 1-2th sidewall 211*c*. In the closed state, the second housing 202 may be positioned at a first distance from the 1-1th sidewall 211*a* and, in the opened state, the second housing 202 may be moved to be positioned at a second distance larger than the first distance from the 1-1th sidewall 211*a*. In an embodiment, the first cover member 211 of the first housing 201 may surround at least a portion of the 2-2th sidewall 221*b* and the 2-3th sidewall 221*c*.

According to various embodiments, the electronic device 101 may include a display 203, a key input device 249, a connector hole 243, audio modules 247*a* and 247*b*, or camera modules 249*a* and 249*b*. According to an embodiment, the electronic device 101 may further include an indicator (e.g., a light emitting diode (LED) device) or various sensor modules.

According to various embodiments, the display 203 may include a first display area A1 and a second display area A2 configured to be exposed to the outside of the electronic device 101 based on the slide of the housing 210. According to an embodiment, the second display area A2 may be received into the inside of the housing 210 (e.g., a slide-in motion) or be visually exposed to the outside of the electronic device 101 (e.g., a slide-out motion) as the first housing 201 moves (e.g., slides) with respect to the second housing 202. According to an embodiment, the first display area A1 may be disposed on the second housing 202. For example, the first display area A1 may be disposed on the second cover member 221. According to an embodiment, the second display area A2 may extend from the first display area A1, and the second display area A2 may be inserted or received in, or visually exposed to the outside of, the first housing 201 as the second housing 202 slides.

According to various embodiments, the second display area A2 may be moved while being substantially guided by one area (e.g., the curved surface 213*a* of FIG. 4) of the first housing 201 to be received in the space positioned in the housing 210 or exposed to the outside of the electronic device 101. According to an embodiment, the second display area A2 may move based on a slide of the second housing 202 in the first direction (e.g., the direction indicated by the arrow η). For example, while the second housing 202 slides, a portion of the second display area A2 may be deformed into a curved shape in a position corresponding to the curved surface 213*a* of the first housing 201.

According to various embodiments, when viewed from above the second cover member 221 (e.g., front cover), if the second housing 202 moves from the closed state to the open state, the second display area A2 may be gradually exposed to the outside of the first housing 201 to be substantially coplanar with the first display area A1. According to an embodiment, the display 203 may be coupled with or disposed adjacent to a touch detection circuit, a pressure sensor capable of measuring the strength (pressure) of touches, and/or a digitizer for detecting a magnetic field-type stylus pen. According to an embodiment, irrespective of the closed state or the open state, the exposed portion of the second display area A2 may be positioned on a portion (e.g., the curved surface 213*a* of FIG. 4A) of the first housing, and a portion of the second display area A2 may remain in the curved shape at the position corresponding to the curved surface 213*a*.

According to various embodiments, the key input device 249 may be positioned in one area of the first housing 201. Depending on the appearance and the state of use, the electronic device 101 may be designed to omit the illustrated key input device 249 or to include additional key input device(s). According to an embodiment, the electronic device 101 may include a key input device (not shown), e.g., a home key button or a touchpad disposed around the home key button. According to an embodiment, at least a portion of the key input device 249 may be disposed on the 1-1th sidewall 211*a*, the 1-2th sidewall 211*b*, or the 1-3th sidewall 211*c* of the first housing 201.

According to various embodiments, the connector hole 243 may be omitted or may receive a connector (e.g., a universal serial bus (USB) connector) for transmitting and receiving power and/or data with an external electronic device. According to an embodiment (not shown), the electronic device 101 may include one or more connector holes 243, and some of the one or more connector holes 243 may function as connector holes for transmitting/receiving audio signals with an external electronic device. In the illustrated embodiment, the connector hole 243 is disposed in the second housing 202, but is not limited thereto. For example, the connector hole 243 or a connector hole not shown may be disposed in the first housing 201.

According to various embodiments, the audio modules 247*a* and 247*b* may include at least one speaker hole 247*a* or at least one microphone hole 247*b*. One of the speaker holes 247*a* may be provided as a receiver hole for voice calls, and the other may be provided as an external speaker hole. The electronic device 101 may include a microphone for obtaining sound. The microphone may obtain external sound of the electronic device 101 through the microphone hole 247*b*. According to an embodiment, the electronic device 101 may include a plurality of microphones to detect the direction of sound. According to an embodiment, the electronic device 101 may include an audio module in which the speaker hole 247*a* and the microphone hole 247*b* are implemented as one hole or may include a speaker without the speaker hole 247*a* (e.g., a piezo speaker).

According to various embodiments, the camera modules 249*a* and 249*b* may include a first camera module 249*a* (e.g., front camera) and/or a second camera module 249*b* (e.g., rear camera). According to an embodiment, the electronic device 101 may include at least one of a wide-angle camera, a telephoto camera, or a close-up camera. According to an embodiment, the electronic device 200 may measure the distance to the subject by including an infrared projector and/or an infrared receiver. The camera modules 249*a* and 249*b* may include one or more lenses, an image sensor, and/or an image signal processor. The first camera module 249*a* may be disposed to face in the same direction as the display 203. For example, the first camera module 249*a* may be disposed in an area around the first display area A1 or overlapping the display 203. When disposed in the area overlapping the display 203, the first camera module 249*a* may capture the subject through the display 203. According to an embodiment, the first camera module 249*a* may include an under display camera (UDC) that has a screen display area (e.g., the first display area A1) that may not be visually exposed but hidden. According to an embodiment, the second camera module 249*b* may capture the subject in a direction opposite to the first display area A1. According to an embodiment, the first camera module 249*a* and/or the second camera module 249*b* may be disposed on the second housing 202.

According to various embodiments, an indicator (not shown) of the electronic device 101 may be disposed on the first housing 201 or the second housing 202, and the indicator may include a light emitting diode to provide state information about the electronic device 101 as a visual signal. The sensor module (not shown) of the electronic device 101 may produce an electrical signal or data value corresponding to the internal operation state or external environment state of the electronic device. The sensor module may include, for example, a proximity sensor, a fingerprint sensor, or a biometric sensor (e.g., an iris/face recognition sensor or a heartrate monitor (HRM) sensor). According to another embodiment, the sensor module may further include, e.g., at least one of a gesture sensor, a gyro sensor, an atmospheric pressure sensor, a magnetic sensor, an acceleration sensor, a grip sensor, a color sensor, an infrared (IR) sensor, a temperature sensor, a humidity sensor, or an illuminance sensor.

Figure 4:
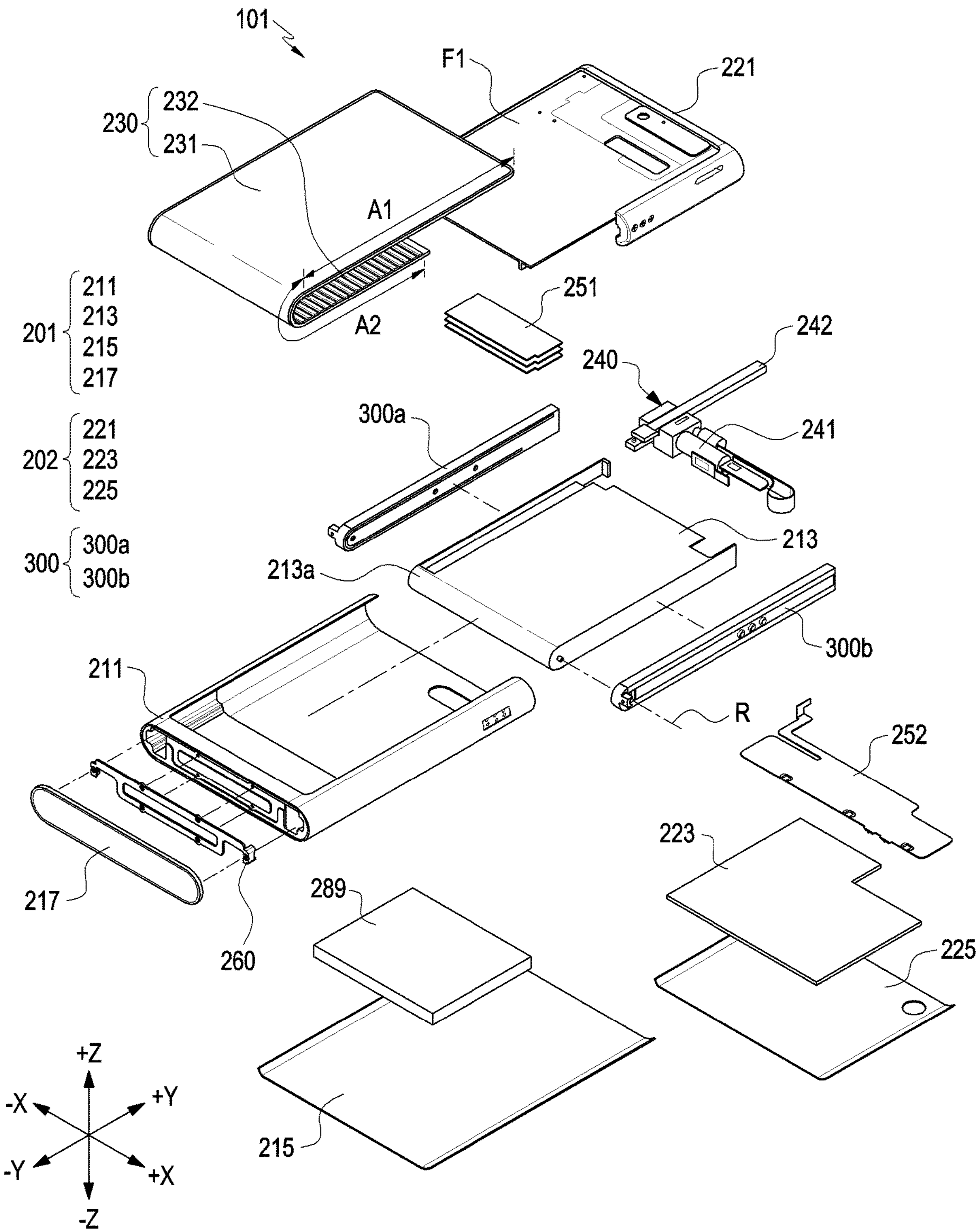
FIG. 4 is an exploded perspective view illustrating an electronic device according to an embodiment of the disclosure.

FIG. 4 is an exploded perspective view illustrating an electronic device according to an embodiment of the disclosure.

Figure 5A:
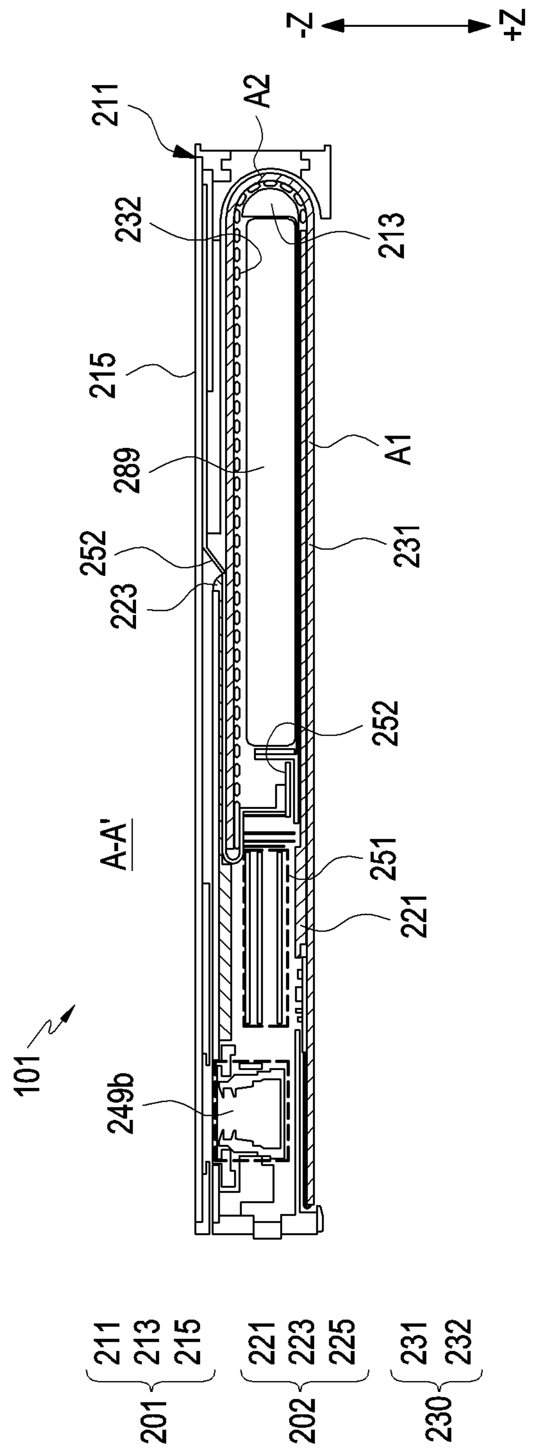
FIG. 5A is a cross-sectional view taken along line A-A' of FIG. 2 according to an embodiment of the disclosure.

FIG. 5A is a cross-sectional view taken along line A-A' of FIG. 2 according to an embodiment of the disclosure.

Figure 5B:
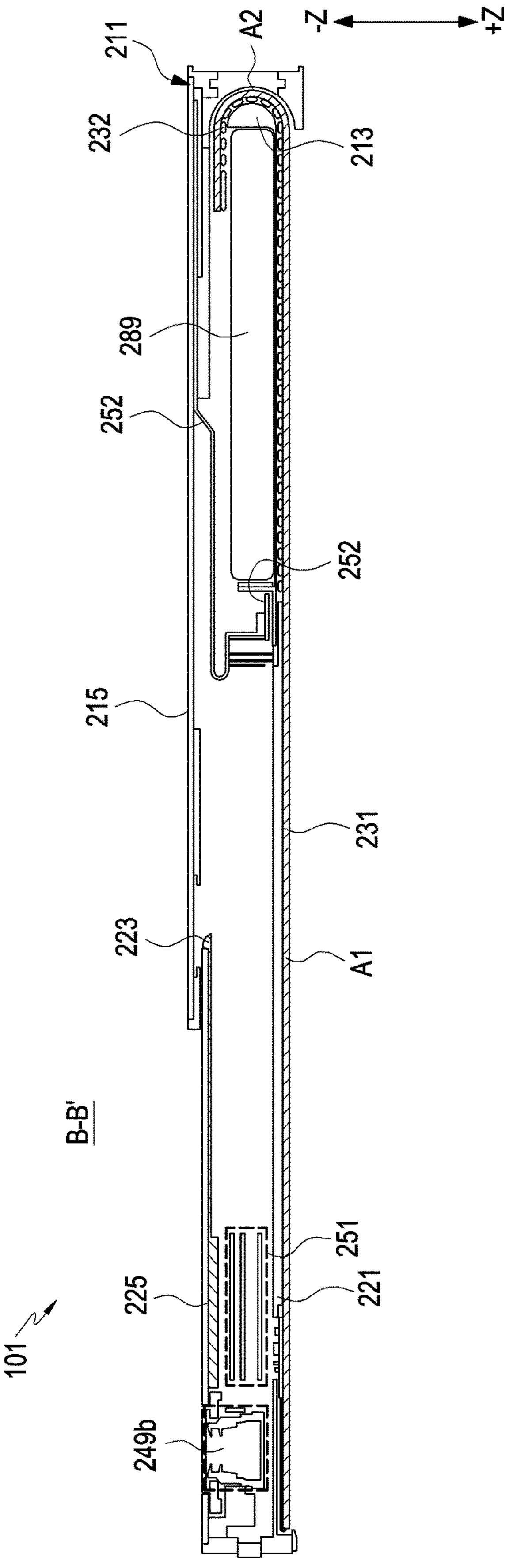
FIG. 5B is a cross-sectional view taken along line B-B' of FIG. 3 according to an embodiment of the disclosure.

FIG. 5B is a cross-sectional view taken along line B-B' of FIG. 3 according to an embodiment of the disclosure.

Referring to FIGS. 4, 5A, and/or 5B, an electronic device 101 may include a first housing 201, a second housing 202, a display assembly 230, and a driving structure 240. The configuration of the first housing 201, the second housing 202, and the display assembly 230 of FIG. 4 may be identical in whole or part to the configuration of the first housing 201, the second housing 202, and the display 203 of FIGS. 2 and/or 3.

According to various embodiments, the first housing 201 may include a first cover member 211 (e.g., the first cover member 211 of FIGS. 2 and 3), a frame 213, and a first rear plate 215.

According to various embodiments, the first cover member 211 may receive at least a portion of the frame 213 and receive a component (e.g., battery 289) positioned in the frame 213. According to an embodiment, the first cover member 211 may surround at least a portion of the second housing 202. According to an embodiment, the second circuit board 252 receiving the electronic component (e.g., the processor 120 and/or the memory 130 of FIG. 1) may be connected to the first cover member 211.

According to various embodiments, the frame 213 may be connected to the first cover member 211. For example, the frame 213 may be connected to the first cover member 211. The second housing 202 is movable relative to the first cover member 211 and/or the frame 213. According to an embodiment, the frame 213 may receive the battery 289. According to an embodiment, the frame 213 may include a curved portion 213*a* facing the display assembly 230.

According to various embodiments, the first rear plate 215 may substantially form at least a portion of the exterior of the first housing 201 or the electronic device 101. For example, the first rear plate 215 may be coupled to the outer surface of the first cover member 211. According to an embodiment, the first rear plate 215 may provide a decorative effect on the exterior of the electronic device 101. The first rear plate 215 may be formed of at least one of metal, glass, synthetic resin, or ceramic.

According to various embodiments, the second housing 202 may include a second cover member 221 (e.g., the second cover member 221 of FIGS. 2 and 3), a rear cover 223, and a second rear plate 225.

According to an embodiment, the second cover member 221 may be connected to the first housing 201 through the guide assembly 300 and, while being guided by the guide assembly 300, reciprocate linearly in one direction (e.g., the direction of arrow η in FIGS. 2 and 3).

According to various embodiments, the second cover member 221 may support at least a portion of the display 203. For example, the second cover member 221 may include a first surface F1. The first display area A1 of the display 203 may be substantially positioned on the first surface F1 to maintain a flat panel shape. According to an embodiment, the second cover member 221 may be formed of a metal material and/or a non-metal (e.g., polymer) material. According to an embodiment, the first circuit board 251 receiving the electronic component (e.g., the processor 120 and/or the memory 130 of FIG. 1) may be connected to the second cover member 221.

According to various embodiments, the rear cover 223 may protect a component (e.g., the first circuit board 251) positioned on the second cover member 221. For example, the rear cover 223 may be connected to the second cover member 221 and may surround at least a portion of the first circuit board 251. According to an embodiment, the rear cover 223 may include an antenna pattern for communicating with an external electronic device of the electronic device 101. For example, the rear cover 223 may include a laser direct structuring (LDS) antenna.

According to various embodiments, the second rear plate 225 may substantially form at least a portion of the exterior of the second housing 202 or the electronic device 101. For example, the second rear plate 225 may be coupled to the outer surface of the second cover member 221. According to an embodiment, the second rear plate 225 may provide a decorative effect on the exterior of the electronic device 101. The second rear plate 215 may be formed of at least one of metal, glass, synthetic resin, or ceramic.

According to various embodiments, the display assembly 230 may include a display 231 (e.g., the display 203 of FIGS. 2 and/or 3) and a multi-bar structure 232 supporting the display 203. According to an embodiment, the display 231 may be referred to as a flexible display, a foldable display, and/or a rollable display.

According to various embodiments, the multi-bar structure 232 may be connected to or attached to at least a portion (e.g., the second display area A2) of the display 231. According to an embodiment, as the second housing 202 slides, the multi-bar structure 232 may move with respect to the first housing 201. In the closed state (e.g., FIG. 2), the multi-bar structure 232 may be mostly received in the first housing 201 and may be positioned between the first cover member 211 and the second cover member 221. According to an embodiment, at least a portion of the multi-bar structure 232 may move corresponding to the curved surface 213*a* positioned at the edge of the frame 213. According to an embodiment, the multi-bar structure 232 may be referred to as a display supporting member or supporting structure.

According to various embodiments, the driving structure 240 may move the second housing 202 relative to the first housing 201. For example, the drive structure 240 may include a motor 241 configured to generate a driving force for sliding the housing 201 and 202. The driving structure 240 may include a gear (e.g., a pinion) connected to the motor 241 and a rack 242 configured to mesh with the gear.

According to various embodiments, the housing in which the rack 242 is positioned and the housing in which the motor 241 is positioned may be different. According to an embodiment, the motor 241 may be connected to the second housing 202. The rack 242 may be connected to the first housing 201. According to another embodiment, the motor 241 may be connected to the first housing 201. The rack 242 may be connected to the second housing 202. Movement of the electronic device 101 by the driving structure 240 according to various embodiments is described in detail with FIGS. 5A, 5B, 6A, and 6B.

According to various embodiments, the first housing 201 may include a protection member 217. According to an embodiment, the protection member 217 may form at least a portion of the exterior of the electronic device 101. According to an embodiment, the protection member 217 may be referred to as a deco member.

According to various embodiments, the electronic device 101 may include a guide bar 260 for connecting the first cover member 211 and the guide assembly 300. For example, the guide bar 260 may be coupled to the guide assembly 300 and the first cover member 211 by a fastening member (e.g., screw). According to an embodiment, the guide bar 260 may be disposed between the first cover member 211 and the protection member 217. For example, the protection member 217 may cover a portion of the first cover member 211 and the guide bar 260. According to an embodiment, the guide bar 260 may be referred to as a fastening bar.

According to various embodiments, the first housing 201 may receive the first circuit board 251 (e.g., a main board). According to an embodiment, a processor (e.g., the processor 120 of FIG. 1), memory (e.g., the memory 130 of FIG. 1), and/or an interface (e.g., the interface 177 of FIG. 1) may be mounted on the first circuit board 251. The processor may include one or more of, e.g., a central processing unit, an application processor, a graphic processing device, an image signal processing, a sensor hub processor, or a communication processor. According to various embodiments, the first circuit board 251 may include a flexible printed circuit board type radio frequency cable (FRC). The first circuit board 251 may be disposed on at least a portion of the second cover member 221 and may be electrically connected to the antenna module and the communication module.

According to an embodiment, the memory may include, e.g., a volatile or non-volatile memory.

According to an embodiment, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to various embodiments, the electronic device 101 may include a second circuit board 252 (e.g., a sub circuit board) spaced apart from the first circuit board 251 (e.g., a main circuit board) in the first housing 201. The second circuit board 252 may be electrically connected to the first circuit board 251 through a connection flexible board. The second circuit board 252 may be electrically connected with electric components disposed in an end area of the electronic device 101, such as the battery 289 or a speaker and/or a sim socket, and may transfer signals and power.

According to various embodiments, the battery 289 may be a device for supplying power to at least one component of the electronic device 101. The battery 189 may include a primary cell which is not rechargeable, a secondary cell which is rechargeable, or a fuel cell. The battery 289 may be integrally or detachably disposed inside the electronic device 101. According to an embodiment, the battery 289 may be formed of a single embedded battery or may include a plurality of removable batteries. According to an embodiment, the battery 289 may be positioned in a frame 213, and the battery 289 may be slid along with the frame 213.

According to various embodiments, the guide assembly 300 may guide movement of the second housing 202 with respect to the first housing 201. For example, the guide assembly 300 may reduce friction of the second housing 202 against the first housing 201. According to an embodiment, a portion of the guide assembly 300 may be coupled to the second cover member 221, and another portion of the guide assembly 300 may be coupled to the frame 213. According to an embodiment, the guide assembly 300 may include a first guide assembly 300*a* positioned on one side (e.g., in the −X direction) of the frame 213 and a second guide assembly 300*b* positioned on the other side (e.g., in the +X direction) of the frame 213.

According to various embodiments, the guide assembly 300 may guide the movement of the multi-bar structure 232. For example, the multi-bar structure 232 may slide along a groove formed in the guide assembly 300. A structure in which the guide assembly 300 guides the movement of the multi-bar structure 232 according to various embodiments is described in detail with reference to FIGS. 6A and/or 6B.

Referring to FIG. 5A, in the electronic device 101 in the contracted or closed state (e.g., the first state), at least a portion of the second housing 202 may be disposed to be received in the first housing 201. As the second housing 202 is disposed to be received in the first housing 201, the volume of the electronic device 101 may decrease. As the second housing 202 is disposed to be received in the first housing 201, the size of the visually exposed area of the display 231 may change.

According to an embodiment, if the second housing 202 is fully received in the first housing 201, the size of the display 231 visually exposed may be minimized. The structure in which the second housing 202 is fully received in the first housing 201 may be referred to as a structure in which the entire receivable area of the second housing 202 is received in the first housing 201. For example, in the first state (e.g., FIG. 5A) in which the first housing 202 is fully received in the first housing 201, the first display area A1 of the display 231 may be visually exposed, and the second display area A2 may not be visually exposed. According to an embodiment, in the first state, at least a portion of the second display area A2 may be disposed between the battery 289 and the rear plates 215 and 225.

Referring to FIG. 5B, according to an embodiment, in the electronic device 101 in the open or extended state (e.g., the second state), the second housing 202 may protrude from the first housing 201. As the second housing 202 protrudes from the first housing 201, the volume of the electronic device 101 may increase. As the second housing 202 protrudes from the first housing 201, the size of the visually exposed area of the display 231 may be changed. For example, in the electronic device 101 in the second state, at least a portion of the second display area A2 of the display 231 may be visually exposed to the outside of the electronic device 101 together with the first display area A1.

Figure 6A:
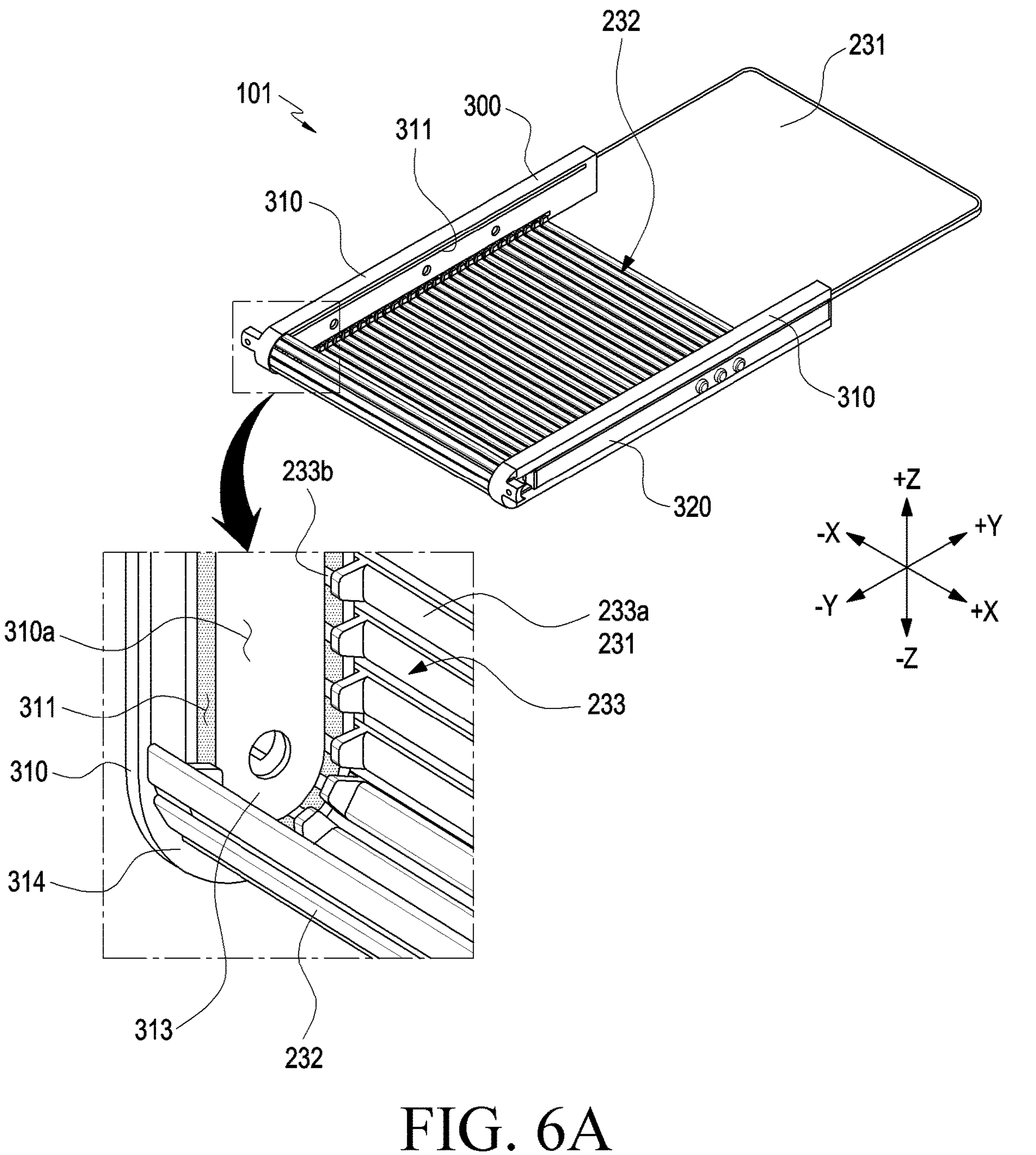
FIG. 6A is a view illustrating movement of a display assembly of an electronic device in a closed state according to an embodiment of the disclosure.

FIG. 6A is a view illustrating movement of a display assembly of an electronic device in a closed state according to an embodiment of the disclosure.

Figure 6B:
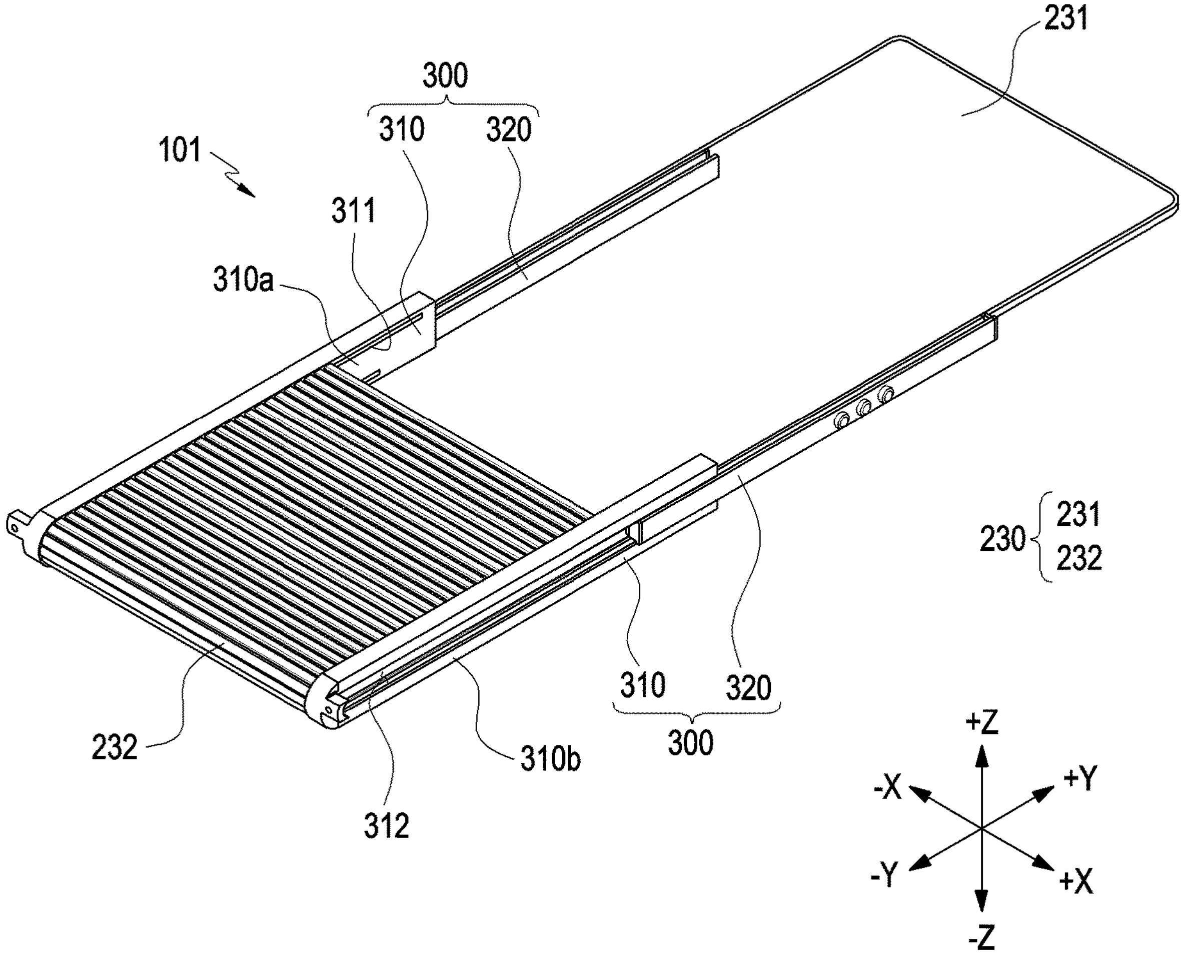
FIG. 6B is a view illustrating movement of a display assembly of an electronic device in an open state according to an embodiment of the disclosure.

FIG. 6B is a view illustrating movement of a display assembly of an electronic device in an open state according to an embodiment of the disclosure.

Referring to FIGS. 6A and 6B, the electronic device 101 may include a display assembly 230 and a guide assembly 300. The configuration of the display assembly 230 and the guide assembly 300 of FIGS. 6A and 6B may be identical in whole or part to the configuration of the display assembly 230 and the guide assembly 300 of FIG. 4.

According to various embodiments, the display assembly 230 may include a display 231 and a multi-bar structure 232 supporting the display 231.

According to various embodiments, the multi-bar structure 232 may include a plurality of bars 233 (or a plurality of rods). The plurality of bars 233 may extend in a straight line, be positioned parallel to the rotational axis (e.g., the rotational axis R of FIG. 4) provided by a curved surface (e.g., the curved surface 213*a* of FIG. 4), and be arranged along a direction (e.g., the sliding direction of the second housing 202) substantially perpendicular to the rotational axis R. According to an embodiment, the plurality of bars 233 may include a supporting area 233*a* disposed under the display 231 and a protruding area 233*b* protruding from the supporting area 233*a*. At least a portion of the protruding area 233*b* may be inserted into the guide assembly 300. According to an embodiment, the protruding area 233*b* may be positioned at two opposite end portions of the supporting area 233*a*.

According to various embodiments, the guide assembly 300 may guide the movement of the display assembly 230 and the housing (e.g., the first housing 201 and the second housing 202 of FIG. 4). For example, the guide assembly 300 may include a guide member 310 for guiding a movement of the display assembly 230 and a rail structure 320 for guiding a relative movement of the first housing 201 with respect to the second housing 202. According to an embodiment, the guide member 310 may be connected to the first housing 201 of FIG. 4, and the rail structure 320 may be connected to the second housing 202 of FIG. 4. For example, the guide member 310, together with the first housing 201, may move relative to the rail structure 320 and the second housing 202. The guide member 310 of the disclosure may be referred to as a rail receiving part or a rail structure receiving part.

According to an embodiment, the guide member 310 may receive at least a portion of the multi-bar structure 232. For example, the guide member 310 may include a first slit 311 for receiving the protruding areas 233*b* of the plurality of bars 233. The first slit 311 may be a groove formed in the first surface 310*a* of the guide member 310 facing the inside of the electronic device 101. For example, at least a portion of the first surface 310*a* may face at least a portion of the display assembly 230.

According to an embodiment, when at least a portion of the multi-bar structure 232 is bent or slides, the protruding areas 233*b* of the plurality of bars 233 may move in a state in which at least a portion thereof is received in the first slit 311 of the guide member 310. For example, the protruding areas 233*b* of the plurality of bars 233 may slide along the guide member 310 while being fitted in the grooved first slit 311 formed in the first surface 310*a* of the guide member 310.

According to an embodiment, the guide member 310 may receive at least a portion of the rail structure 320. The second slit 312 may receive at least a portion of the rail structure 320. According to an embodiment, the second slit 312 may be a groove formed in the second surface 310*b* opposite to the first surface 310*a*.

According to an embodiment, the rail structure 320 may move relative to the guide member 310 while being received in the second slit 312 of the guide member 310. For example, the rail structure 320 may slide along the second slit 312. According to an embodiment, the rail structure 320 may support the electronic device 101, thereby enhancing the bending rigidity of the electronic device 101.

According to various embodiments, the guide member 310 may provide pressure to the plurality of bars 233 based on driving of the motor (e.g., the motor 241 of FIG. 4). According to an embodiment, the second housing 202 (e.g., the second cover member 221) may move relative to the first housing 201 (e.g., the frame 213) by the driving force generated by the motor 241. When the first housing 201 moves relative to the second housing 202, the inner portion 313 and/or the outer portion 314 of the guide member 310 may provide pressure to the plurality of bars 233 positioned in the first slit 311. At least a portion of the display assembly 230 may be unrolled or rolled based on the pressure received from the guide member 310.

According to an embodiment, when the electronic device 101 slides out, the inner portion 313 of the guide member 310 may provide pressure to the protruding areas 233*b* of the plurality of bars 233. By the pressure provided by the protruding area 233*b*, the plurality of bars 233 may move along the first slit 311 of the guide member 310, and the electronic device 101 and/or the display assembly 230 may be changed to the unrolled state (e.g., FIG. 6B). When the electronic device 101 is unrolled, at least a portion of the display assembly 230 received between the first cover member 211 and the frame 213 of FIG. 4 may be extended to the front surface.

According to an embodiment, when the electronic device 101 slides in, the outer portion 314 of the guide member 310 may provide pressure to the protruding areas 233*b* of the plurality of bars 233. By the pressure provided to the protruding areas 233*b*, the plurality of bars 233 may move along the first slit 311 of the guide member 310, and the electronic device 101 and/or the display assembly 230 may be changed to the closed state (e.g., FIG. 6A). When the display assembly 230 is rolled, at least a portion of the display assembly 230 of FIG. 4 may be received between the first cover member (e.g., the first cover member 211 of FIG. 5A) and the frame 213.

Figure 7:
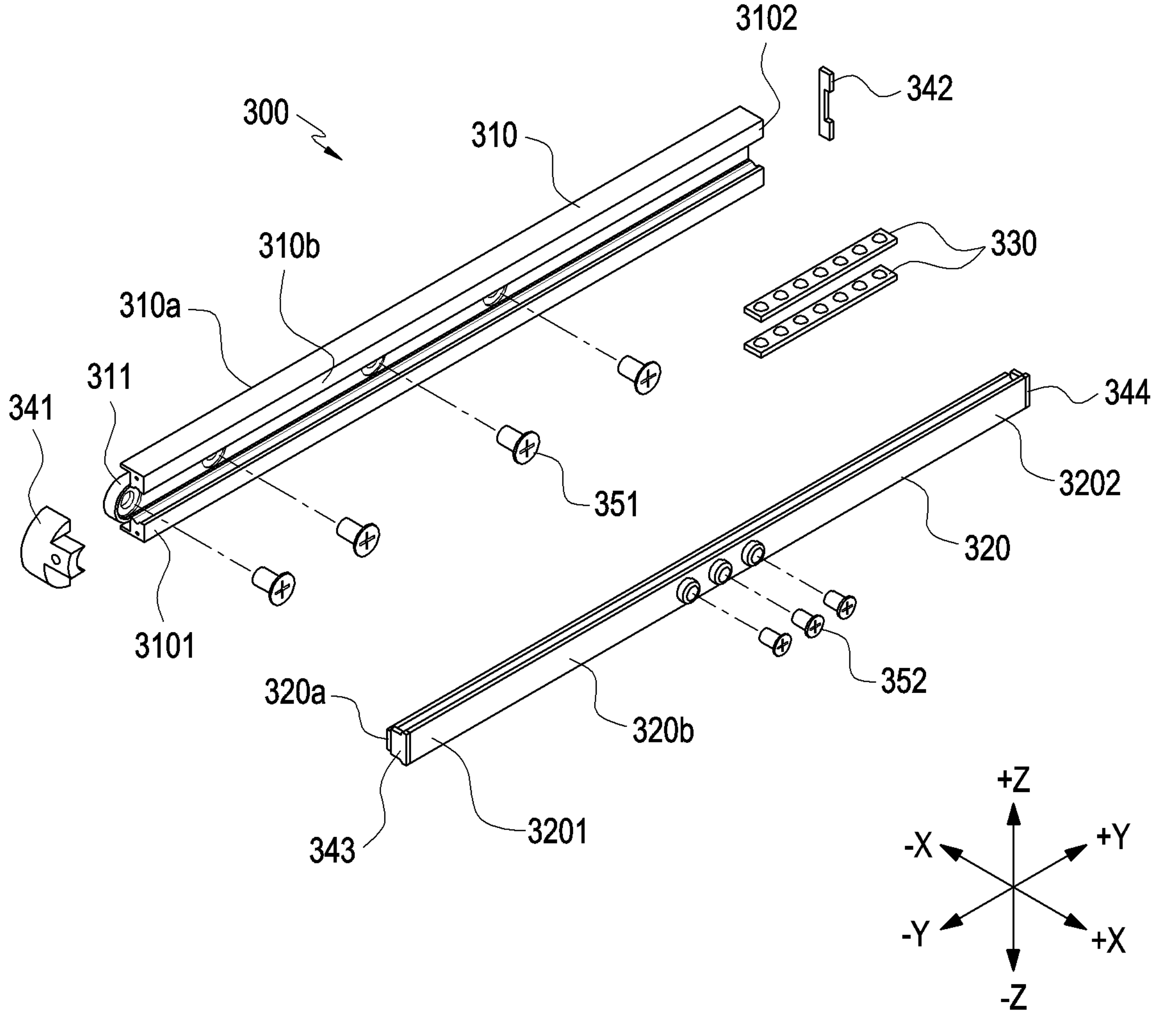
FIG. 7 is an exploded perspective view illustrating a guide assembly according to an embodiment of the disclosure.

FIG. 7 is an exploded perspective view illustrating a guide assembly according to an embodiment of the disclosure.

Figure 8A:
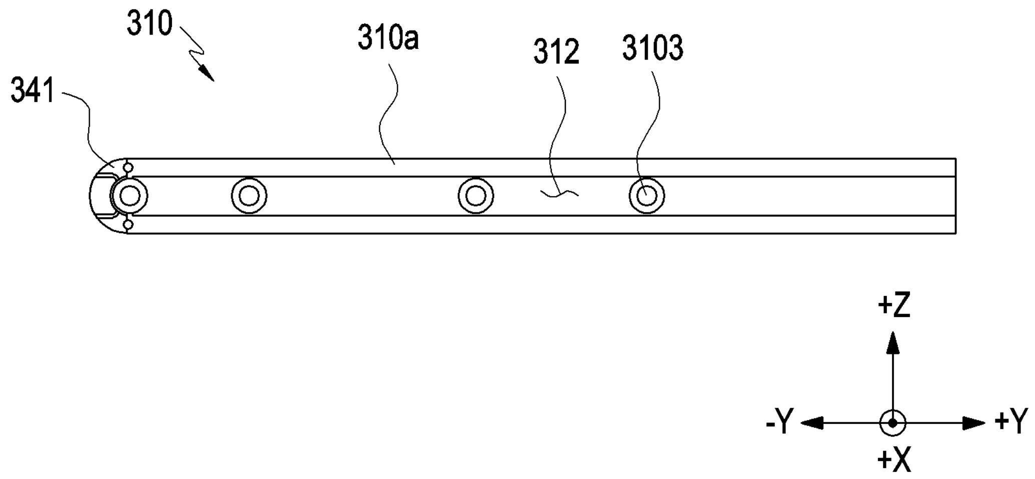
FIG. 8A is a front view illustrating a guide member according to an embodiment of the disclosure.

FIG. 8A is a front view illustrating a guide member according to an embodiment of the disclosure.

Figure 8B:
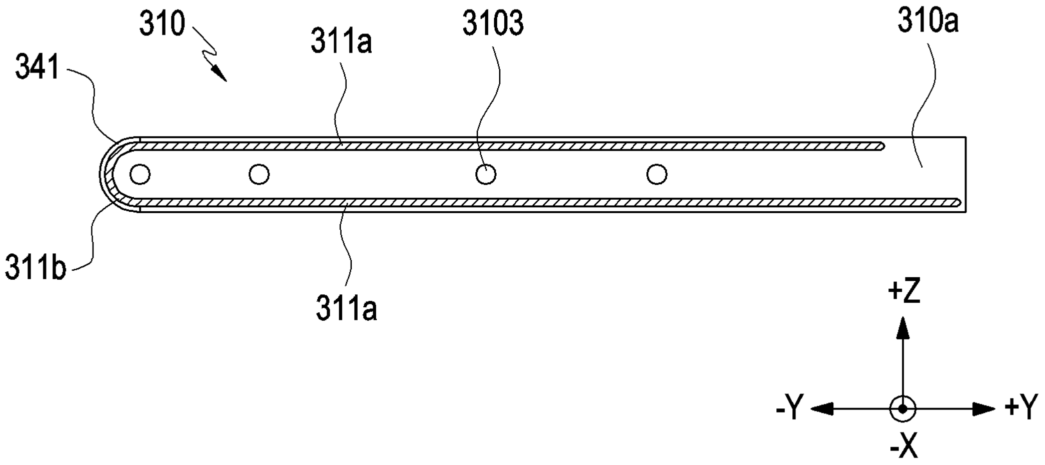
FIG. 8B is a rear view illustrating a guide member according to an embodiment of the disclosure.

FIG. 8B is a rear view illustrating a guide member according to an embodiment of the disclosure.

Figure 9A:
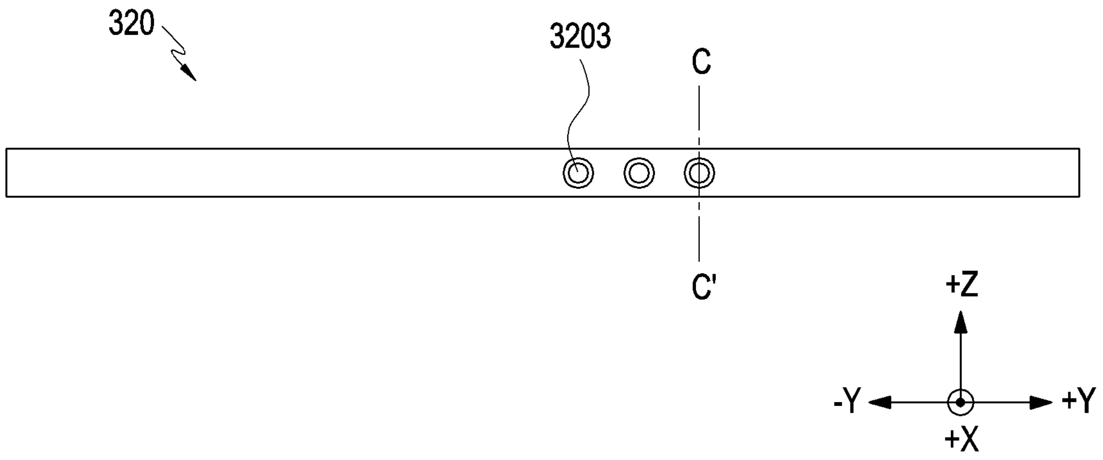
FIG. 9A is a front view illustrating a rail structure according to an embodiment of the disclosure.

FIG. 9A is a front view illustrating a rail structure according to an embodiment of the disclosure.

Figure 9B:
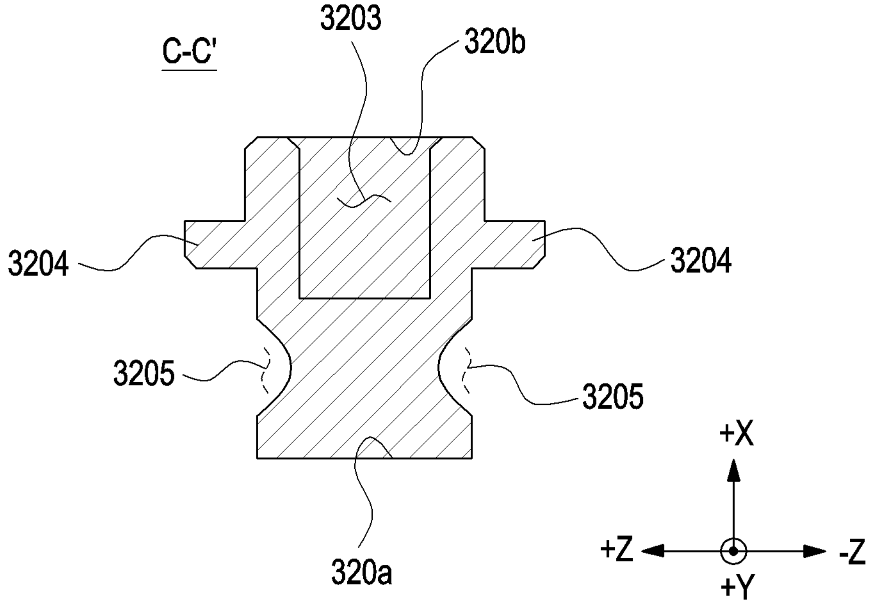
FIG. 9B is a cross-sectional view illustrating a rail structure according to an embodiment of the disclosure.

FIG. 9B is a cross-sectional view illustrating a rail structure according to an embodiment of the disclosure.

Referring to FIGS. 7, 8A, 8B, 9A, 9B, and/or 10, the guide assembly 300 may include a guide member 310 and a rail structure 320 configured to move relative to the guide member 310. The configuration of the guide member 310 and the rail structure 320 of FIGS. 7, 8A, 8B, 9A, 9B, and/or 10 may be identical in whole or part to the configuration of the guide member 310 and the rail structure 320 of FIGS. 6A and/or 6B.

According to various embodiments, the guide member 310 may guide the movement of the display supporting member (e.g., the multi-bar structure 232 of FIG. 6A) and the rail structure 320. For example, the guide member 310 may include a first slit 311 formed in the first surface 310*a* and a second slit 312 formed in the second surface 310*b* opposite to the first surface 310*b*. The first slit 311 may guide the movement of the multi-bar structure 232, and the second slit 312 may guide the movement of the rail structure 320. The first slit 311 may be interpreted as a slit positioned opposite to the second slit 312. According to an embodiment, the guide member 310 may be referred to as a guide block or a block.

According to various embodiments, the guide member 310 may include a first end portion 3101 and a second end portion 3102 opposite to the first end portion 3101. According to an embodiment, the guide assembly 300 may include a first block cover 341 connected to the first end portion 3101 and a second block cover 342 connected to the second end portion 3102. According to an embodiment, the first block cover 341 may connect the guide member 310 to a guide bar (e.g., the guide bar 260 of FIG. 4). According to an embodiment, the second block cover 342 may prevent or reduce escape of the rail structure 320 from the guide member 310.

According to various embodiments, the guide member 310 may be connected to a first housing (e.g., the first housing 201 of FIG. 4). For example, the guide member 310 may be connected to a structure (e.g., the frame 213 of FIG. 4) through at least one first fastening member 351. According to an embodiment, the guide member 310 may include at least one first fastening hole 3103 that penetrates the first surface 310*a* and the second surface 310*b* to receive the first fastening member 351.

According to various embodiments, at least a portion of the first slit 311 may be bent. For example, the first slit 311 may include at least one substantially linear first groove area 311*a* and a second groove area 311*b* extending from the linear groove and bent. For example, the first groove area 311*a* may extend along the first direction (e.g., the Y-axis direction). For example, the first slit 311 may be a substantially "U"-shaped groove.

According to various embodiments, the rail structure 320 may move relative to the guide member 310. For example, the rail structure 320 may slide or perform translational motion in the second slit 312 of the guide member 310. According to an embodiment, the rail structure 320 may include a third surface 320*a* facing the guide member 310 and a fourth surface 320*b* opposite to the third surface 320*a*. According to an embodiment, the rail structure 320 may include a protruding portion 3204 that is not inserted into the second slit 312. For example, at least a portion of the protruding portion 3204 may face the second surface 310*b* of the guide member 310 and/or the friction reducing structure 330. According to an embodiment, the protruding portion 3204 may be connected to the friction reducing structure 330. For example, the cage structure 332 (e.g., the cage structure 332 of FIG. 10A) of the friction reducing structure 330 may be connected to the protruding portion 3204 using an adhesive member (e.g., an adhesive tape or an adhesive). According to an embodiment, the rail structure 320 may include a receiving area 3205 for receiving at least a portion (e.g., the ball 331 of FIG. 10A) of the friction reducing structure 330. The receiving area 3205 may be a groove or a recess formed in the rail structure 320.

According to various embodiments, the rail structure 320 may include a third end portion 3201 and a fourth end portion 3202 opposite to the third end portion 3201. According to an embodiment, the guide assembly 300 may include a first rail cover 343 connected to the third end portion 3201 and a second rail cover 344 connected to the fourth end portion 3202. According to an embodiment, in a state in which the electronic device 101 is closed (e.g., FIG. 2), the third end portion 3201 may be adjacent to the first end portion 3101 of the guide member 310, and the fourth end portion 3202 may be adjacent to the second end portion 3102 of the guide member 310.

According to various embodiments, the rail structure 320 may be connected to a second housing (e.g., the second housing 202 of FIG. 4). For example, the rail structure 320 may be connected to a structure (e.g., the second cover member 221 of FIG. 4) through at least one second fastening member 352. According to an embodiment, the rail structure 320 may include at least one second fastening hole 3203 that penetrates the third surface 320*a* and the fourth surface 320*b* to receive the second fastening member 352. According to an embodiment, the second fastening hole 3203 may be referred to as a tapping hole.

According to various embodiments, the guide assembly 300 may include a friction reducing structure 330 disposed between the rail structure 320 and the guide member 310. The structure of the friction reducing structure 330 according to various embodiments is described in detail below.

Figure 10A:
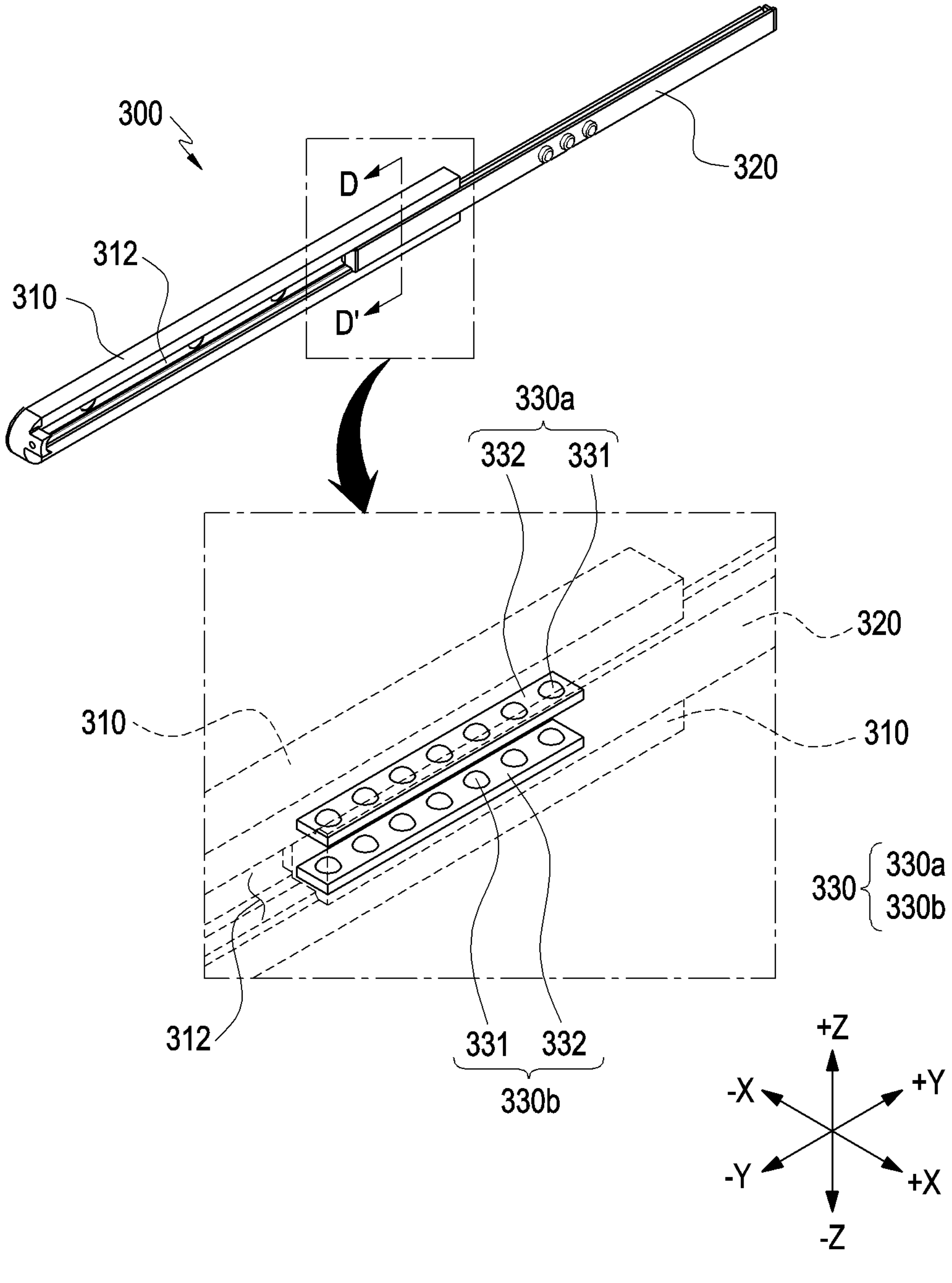
FIG. 10A is a perspective view illustrating an electronic device including a friction reducing structure according to an embodiment of the disclosure.

FIG. 10A is a perspective view illustrating an electronic device including a friction reducing structure according to an embodiment of the disclosure.

Figure 10B:
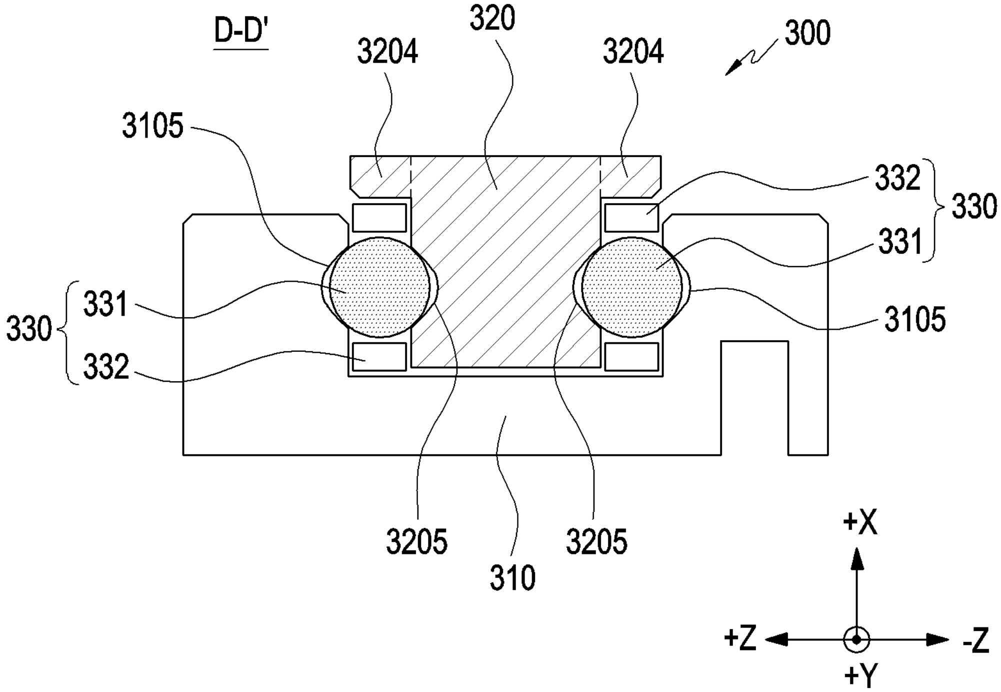
FIG. 10B is a cross-sectional view illustrating a guide assembly including a friction reducing structure according to an embodiment of the disclosure.

FIG. 10B is a cross-sectional view illustrating a guide assembly including a friction reducing structure according to an embodiment of the disclosure.

Figure 11:
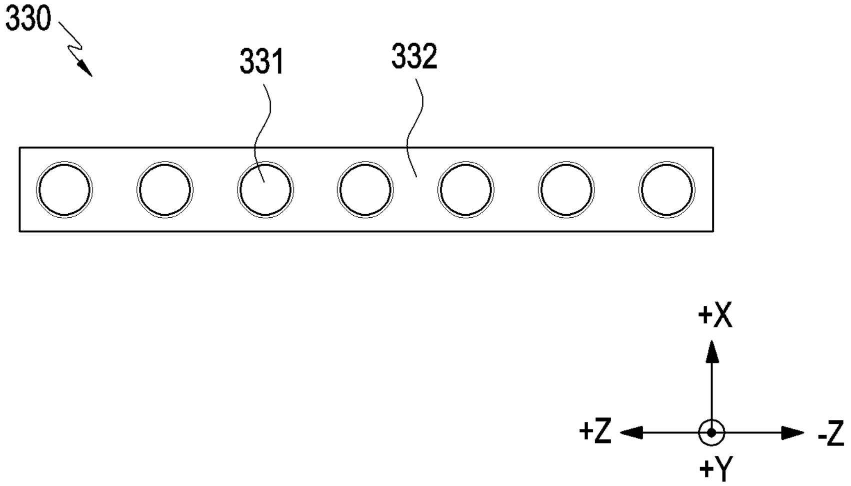
FIG. 11 is a top view illustrating a friction reducing structure according to an embodiment of the disclosure.

FIG. 11 is a top view illustrating a friction reducing structure according to an embodiment of the disclosure.

Figure 12:
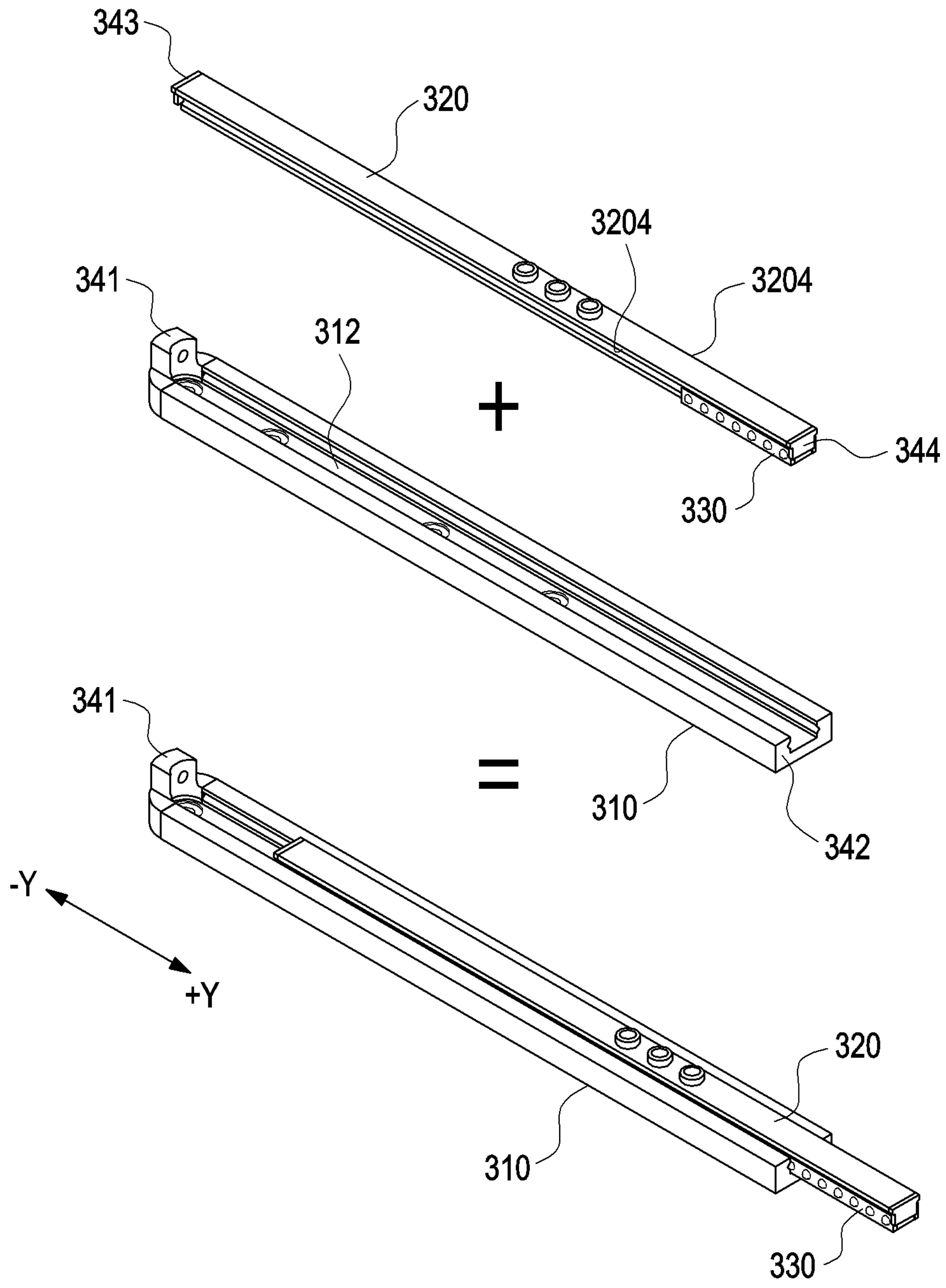
FIG. 12 is a view illustrating coupling of a guide member and a rail structure according to an embodiment of the disclosure.

FIG. 12 is a view illustrating coupling of a guide member and a rail structure according to an embodiment of the disclosure.

Figure 13:
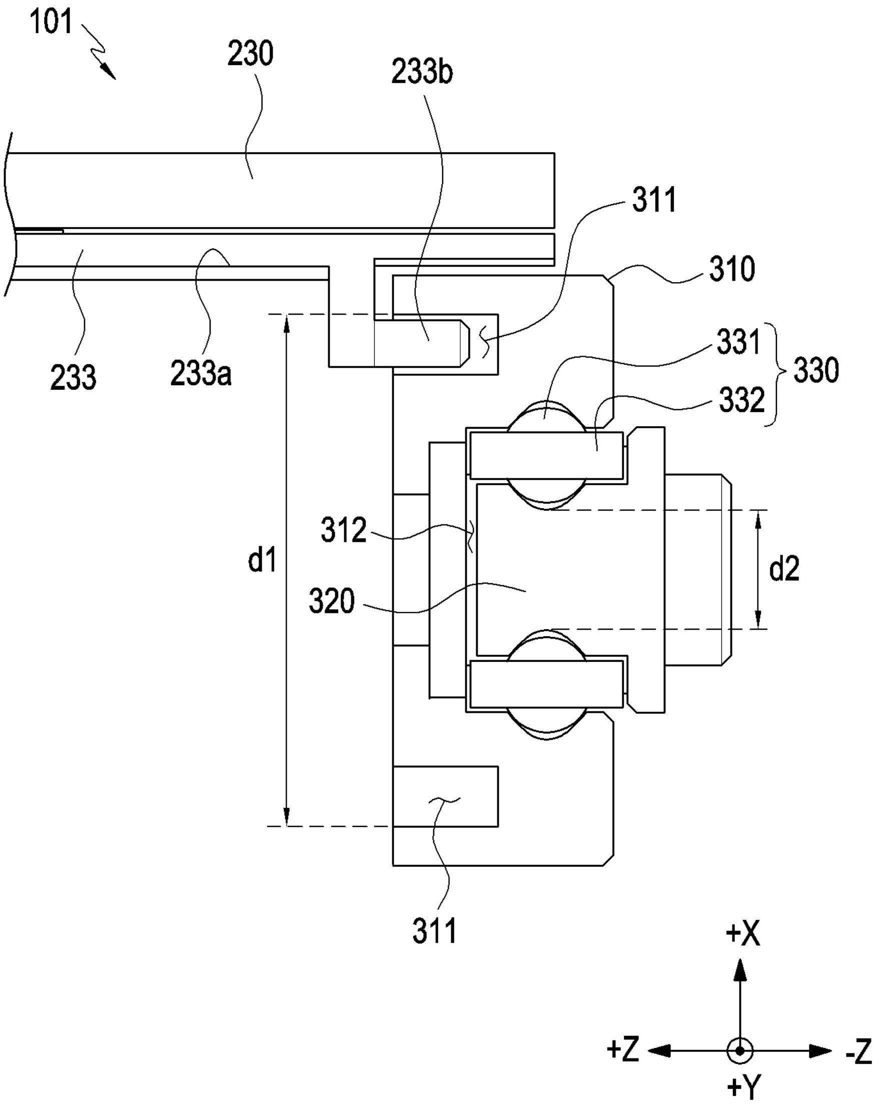
FIG. 13 is a cross-sectional view illustrating a guide assembly and a multi-bar structure according to an embodiment of the disclosure.

FIG. 13 is a cross-sectional view illustrating a guide assembly and a multi-bar structure according to an embodiment of the disclosure.

Figure 14:
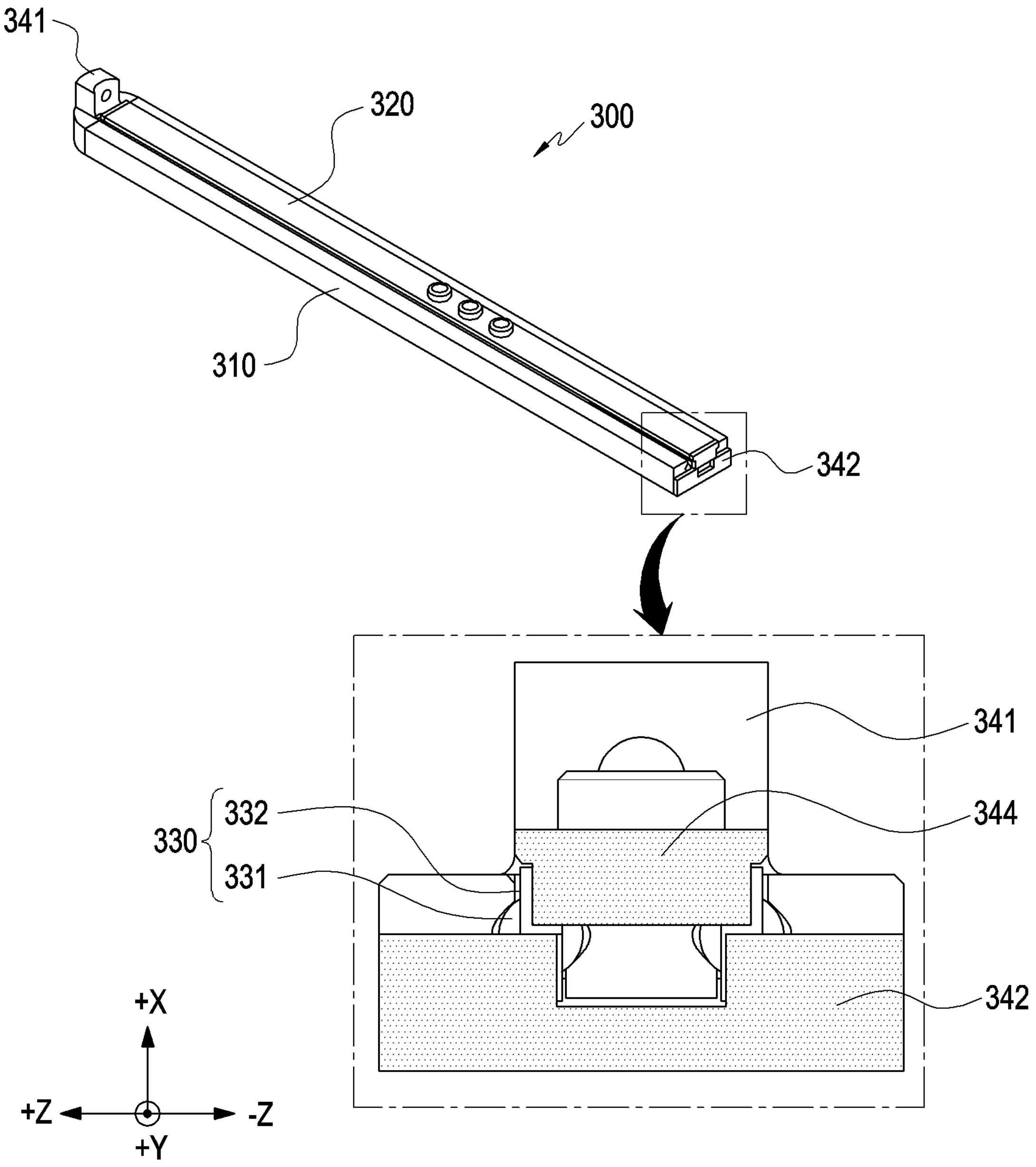
FIG. 14 is a perspective view illustrating a guide assembly including a block cover and a rail cover according to an embodiment of the disclosure.

FIG. 14 is a perspective view illustrating a guide assembly including a block cover and a rail cover according to an embodiment of the disclosure.

Referring to FIGS. 10A, 10B, 11, 12, 13, and/or 14, the guide assembly 300 may include a guide member 310, a rail structure 320, a friction reducing structure 330, block covers 341 and 342, and rail covers 343 and 344. The configuration of the display assembly 300, the guide member 310, the rail structure 320, and the friction reducing structure 330 of FIGS. 10A, 10B, 11, 12, and/or 13 may be identical in whole or part to the configuration of the display assembly 230 of FIG. 4 and the guide member 310, the rail structure 320, the friction reducing structure 330, the block covers 341 and 342, and the rail covers 343 and 344 of FIG. 7.

According to various embodiments, the friction reducing structure 330 may reduce friction generated when the guide member 310 moves relative to the rail structure 320. According to an embodiment, the friction reducing structure 330 may include at least one ball 331 contacting the guide member 310 and the rail structure 320. For example, the ball 331 may reduce the contact area between the guide member 310 and the rail structure 320. The ball 331 may be substantially in point contact with the guide member 310 and the rail structure 320. According to an embodiment, the ball 331 may be referred to as a bearing. According to an embodiment, various design changes may be made to the number and/or shape of the balls 331.

According to various embodiments, the guide member 310 and the rail structure 320 may be formed in a shape for receiving the ball 331. For example, the guide member 310 may include a first groove area 3105 formed in the second slit 312. According to an embodiment, the first groove area 3105 may be interpreted as a groove formed in the central area of the second slit 312. The rail structure 320 may include a second groove area 3205 facing at least a portion of the first groove area 3105. According to an embodiment, the ball 331 may be positioned between the first groove area 3105 of the guide member 310 and the second groove area 3205 of the rail structure 320. According to an embodiment, the first distance d1 between the first slits 311 may be longer than the width of the second slit 312. According to an embodiment, the first distance d1 between the first slits 311 may be longer than the second distance d2 between the balls 331. According to an embodiment, the friction reducing structure 330 may be inserted into the second slit 312 using a jig.

According to various embodiments, the friction reducing structure 330 may include a cage structure 332 for receiving the ball 331. According to an embodiment, the ball 331 may be rotatably disposed in the cage structure 332. According to an embodiment, the cage structure 332 may maintain substantially uniform intervals between the plurality of balls 331. According to an embodiment, the cage structure 332 may be connected to the rail structure 320. According to an embodiment, the cage structure 332 may be disposed between the protruding portion 3204 of the rail structure 320 and the guide member 310.

According to various embodiments, the guide assembly 300 may include a plurality of friction reducing structures 330. For example, the friction reducing structure 330 may include a first friction reducing structure 330*a* and a second friction reducing structure 330*b* spaced apart from the first friction reducing structure 330*a*. According to an embodiment, the first friction reducing structure 330*a* may be positioned above the rail structure 320, and the second friction reducing structure 330*b* may be positioned below the rail structure 320. According to an embodiment, the friction reducing structure 330 may be disposed adjacent to a second end portion (e.g., the second end portion 3102 of FIG. 7) of the guide member 310.

According to various embodiments, the second block cover 342 may prevent escape of the rail structure 320 from the guide member 310. For example, in a state in which the guide assembly 300 is maximally extended, the first rail cover 343 connected to the third end portion (e.g., the third end portion 3201 of FIG. 7) of the rail structure 320 may contact the second block cover 342, preventing escape of the rail structure 320.

According to an embodiment, the first block cover 341 may be attached to the first end portion 3101 of the guide member 310, and the second block cover 342 may be attached (e.g., fitted) to the second end portion 3102. According to an embodiment, the first rail cover 343 may be attached (e.g., fitted) to the third end portion 3201 of the rail structure 320, and the second rail cover 344 may be attached to the fourth end portion 3202 of the rail structure 320. According to an embodiment, the second block cover 342 and the second rail cover 344 may prevent or reduce escape of the friction reducing structure 330 from the second slit 312.

In various embodiments of the disclosure, the block covers 341 and 342 may be provided as separate components from the guide member 310 and then assembled, and the rail covers 343 and 344 may be provided as separate components from the rail structure 320 and then assembled. However, this is for convenience of processing, and the structures of the block covers 341 and 342 and the rail covers 343 and 344 are not limited thereto. For example, in another embodiment (not illustrated), the first block cover 341 and/or the second block cover 342 may be integrally formed with the guide member 310. The first rail cover 343 and/or the second rail cover 344 may be integrally formed with the rail structure 320.

Figure 15:
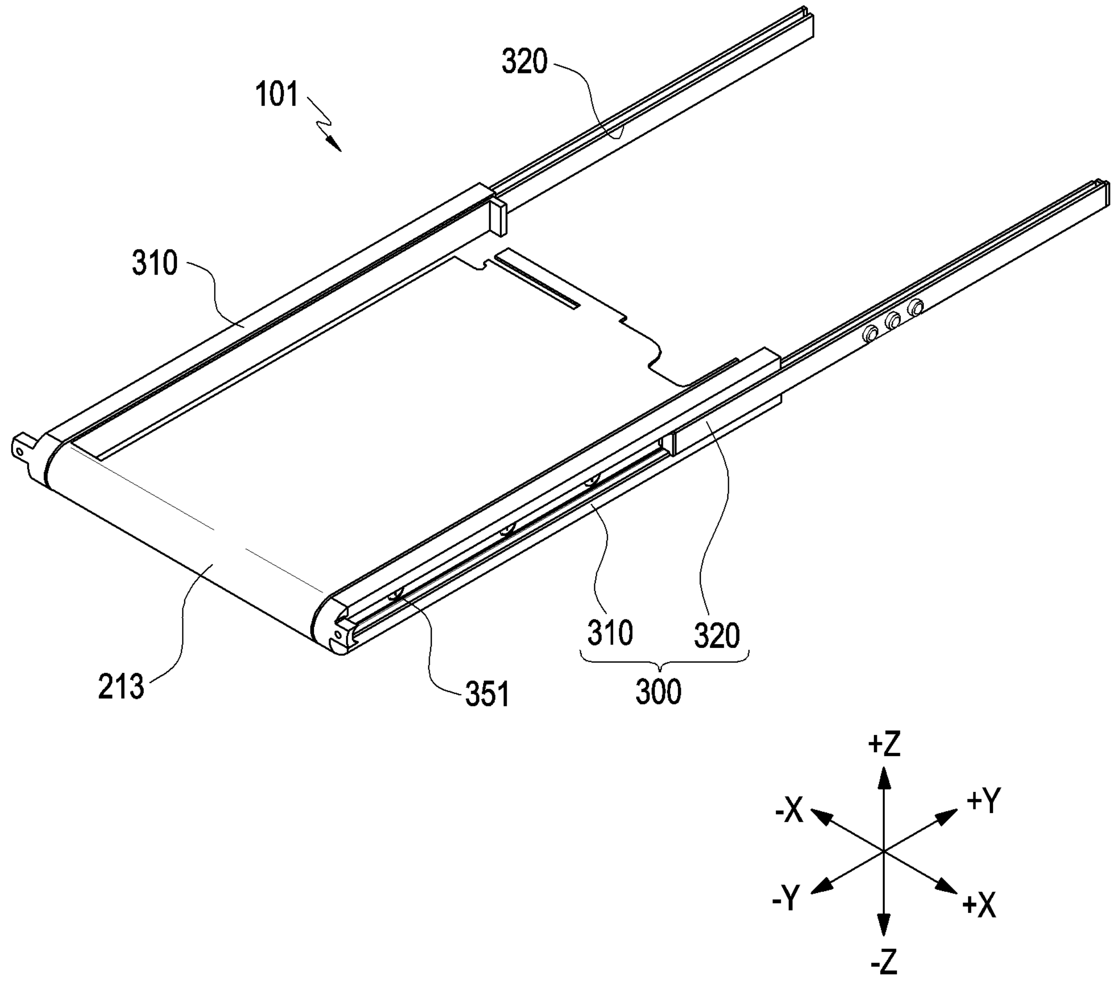
FIG. 15 is a perspective view illustrating an electronic device including a guide assembly and a frame according to an embodiment of the disclosure.

FIG. 15 is a perspective view illustrating an electronic device including a guide assembly and a frame according to an embodiment of the disclosure.

Figure 16:
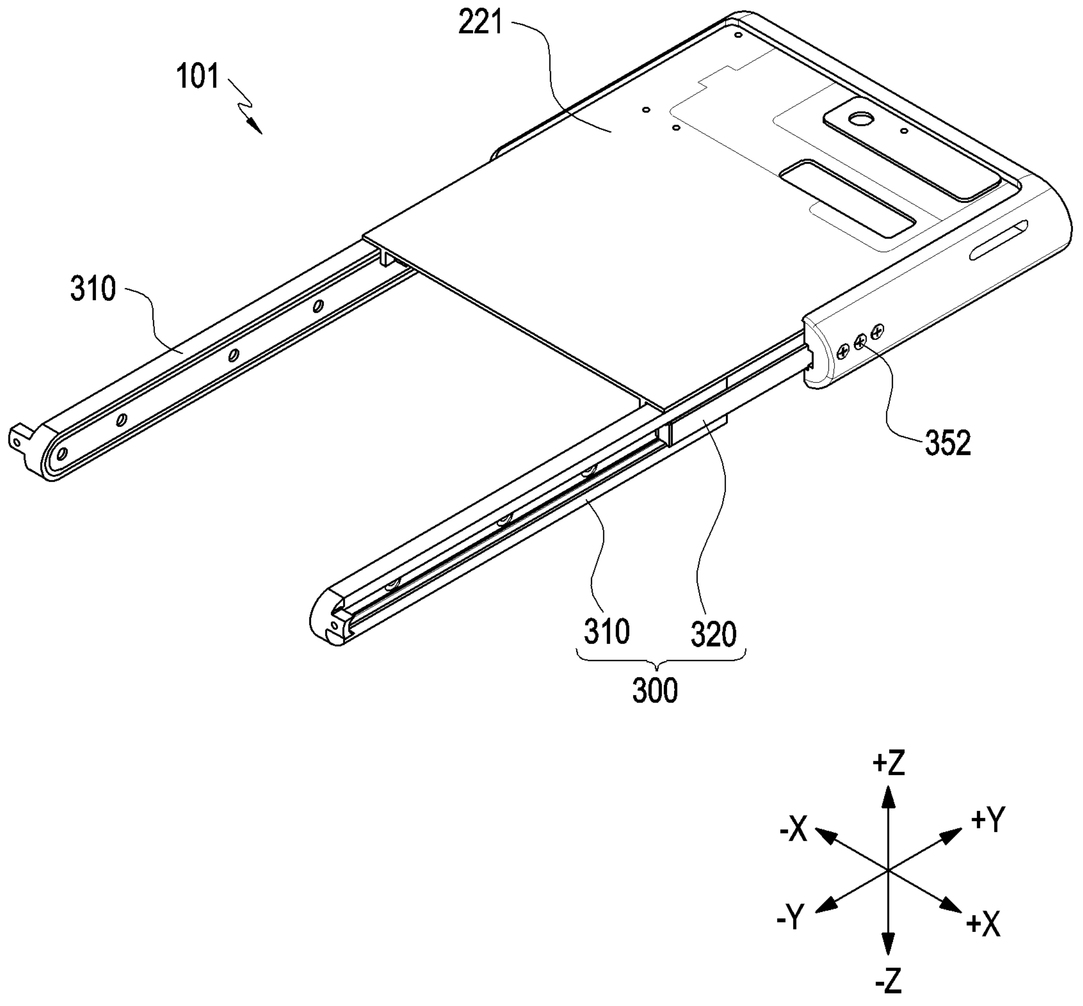
FIG. 16 is a perspective view illustrating an electronic device including a guide assembly and a second cover member according to an embodiment of the disclosure.

FIG. 16 is a perspective view illustrating an electronic device including a guide assembly and a second cover member according to an embodiment of the disclosure.

Figure 17:
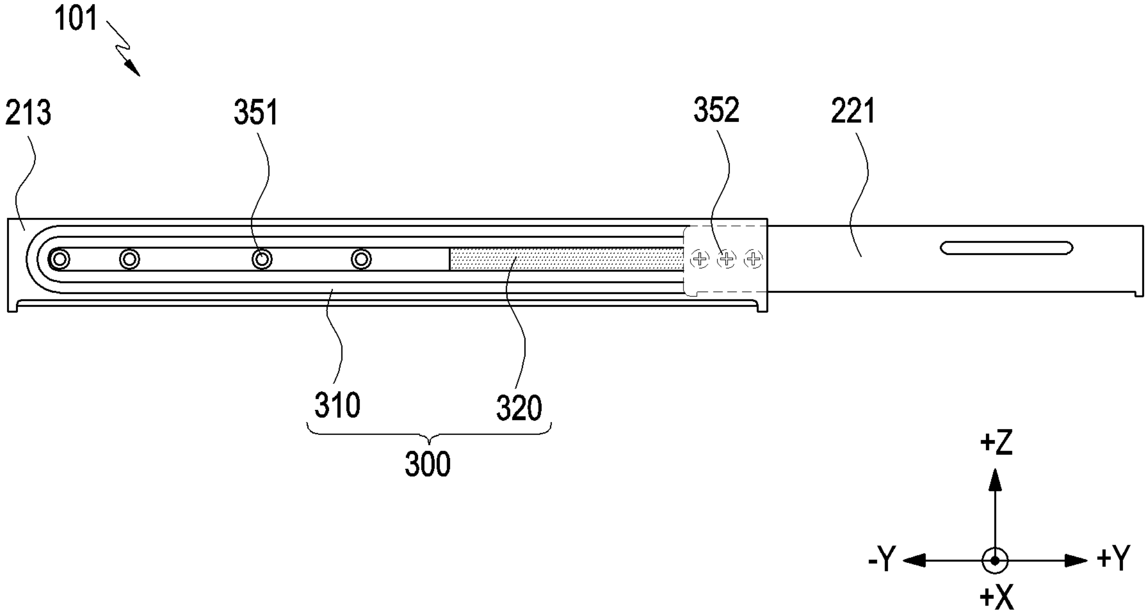
FIG. 17 is a side view illustrating an electronic device including a guide assembly and a second cover member according to an embodiment of the disclosure.

FIG. 17 is a side view illustrating an electronic device including a guide assembly and a second cover member according to an embodiment of the disclosure.

Figure 18:
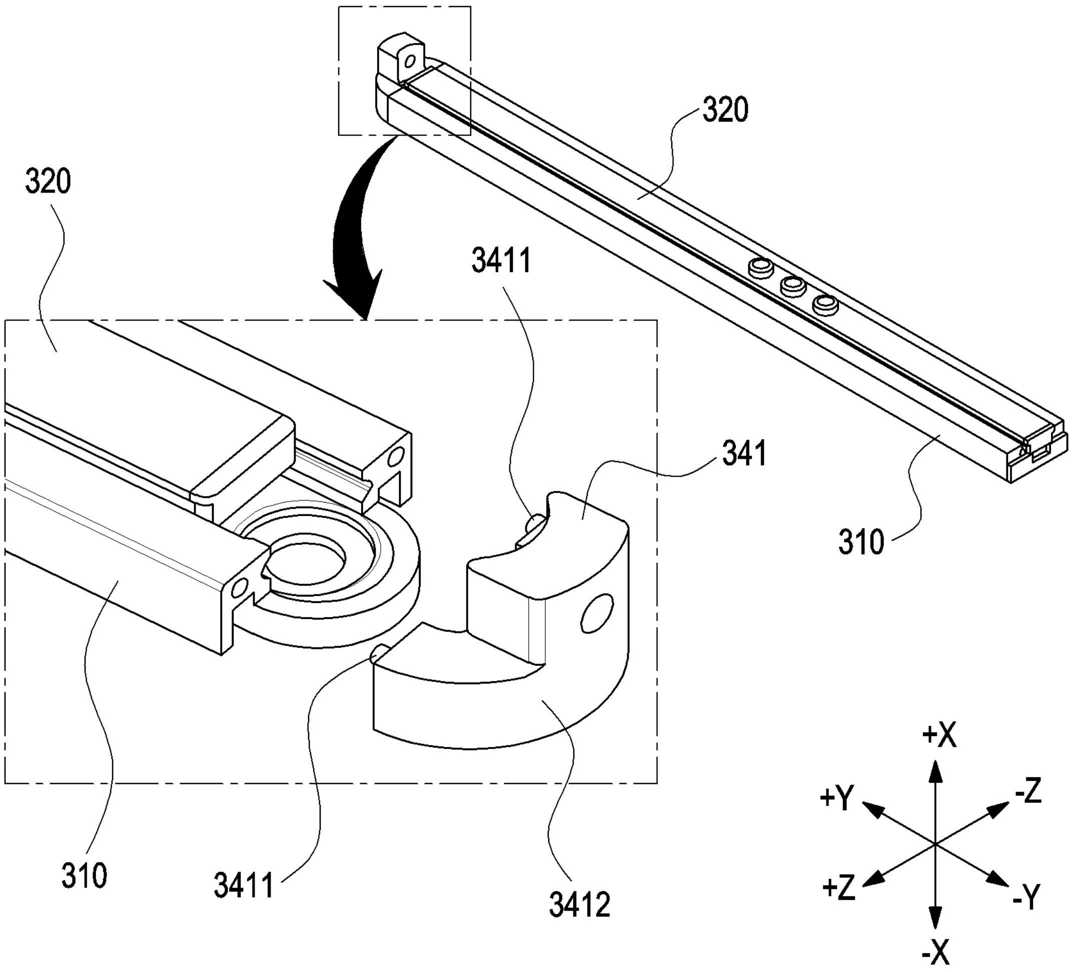
FIG. 18 is a perspective view illustrating an electronic device except for a first cover member according to an embodiment of the disclosure.

FIG. 18 is a perspective view illustrating an electronic device except for a first cover member according to an embodiment of the disclosure.

Figure 19:
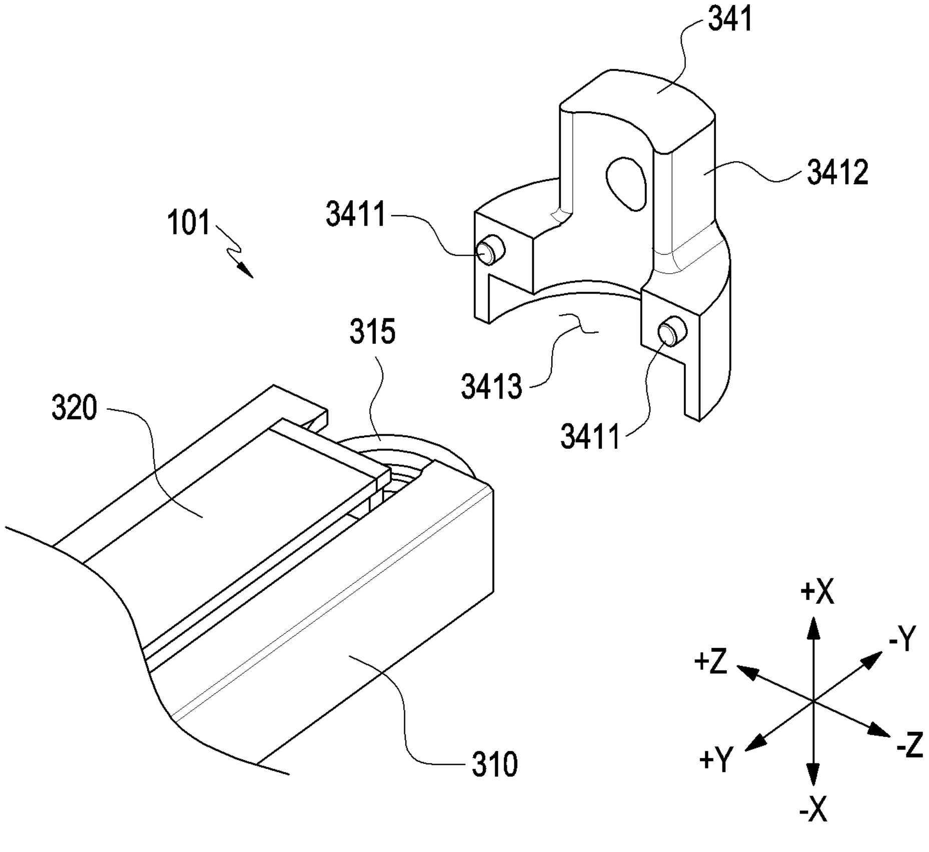
FIG. 19 is a cross-sectional view taken along line F-F' of FIG. 20 according to an embodiment of the disclosure.

FIG. 19 is a cross-sectional view taken along line F-F' of FIG. 18 according to an embodiment of the disclosure.

The configuration of the frame 213, the second cover member 221, and the guide assembly 300 of FIGS. 15, 16, 17, 18, and/or 19 may be identical in whole or part to the configuration of the frame 213, the second cover member 221, and the guide assembly 300 of FIG. 4.

According to various embodiments, the guide assembly 300 may be connected to a housing (e.g., the first housing 201 and/or the second housing 202 of FIG. 4). The first housing 201 and the second housing 202 may perform a translational motion with respect to each other using the guide assembly 300. For example, the guide member 310 may be connected to a component (e.g., the frame 213) of the first housing 201, and the rail structure 320 may be connected to a component (e.g., the second cover member 221) of the second housing 202.

According to an embodiment, the guide member 310 may be fastened to the frame 213 using the first fastening member 351. For example, the frame 213 may include a fastening hole for receiving the first fastening member 351. When the guide member 310 is fastened to the frame 213, the rail structure 320 may be in a slide-out state. According to an embodiment, the rail structure 320 may be fastened to the second cover member 221 using the second fastening member 352. For example, the second fastening member 352 may include a fastening hole for receiving the second fastening member 352. According to an embodiment, the shape and/or number of the first fastening holes 3103 and/or the second fastening holes 3203 may be variously changed based on a required coupling force. However, in order to enhance fastening stability, the number of first fastening holes 3103 and the number of second fastening holes 3203 may be two or more.

According to an embodiment, the first housing (e.g., the frame 213) may move together with the guide member 310, and the second housing (e.g., the second cover member 221) may move together with the rail structure 320. For example, when the rail structure 320 moves relative to the guide member 310 along the second slit 312 of the guide member 310, the second cover member 221 may move relative to the frame 213.

In various embodiments of the disclosure, the frame 213 may be provided as a separate component from the guide member 310 and then assembled. However, this is for convenience of processing, and the structure of the frame 213 and the guide member 310 is not limited thereto. For example, in another embodiment (not shown), the frame 213 may be integrally formed with the guide member 310.

Figure 20:
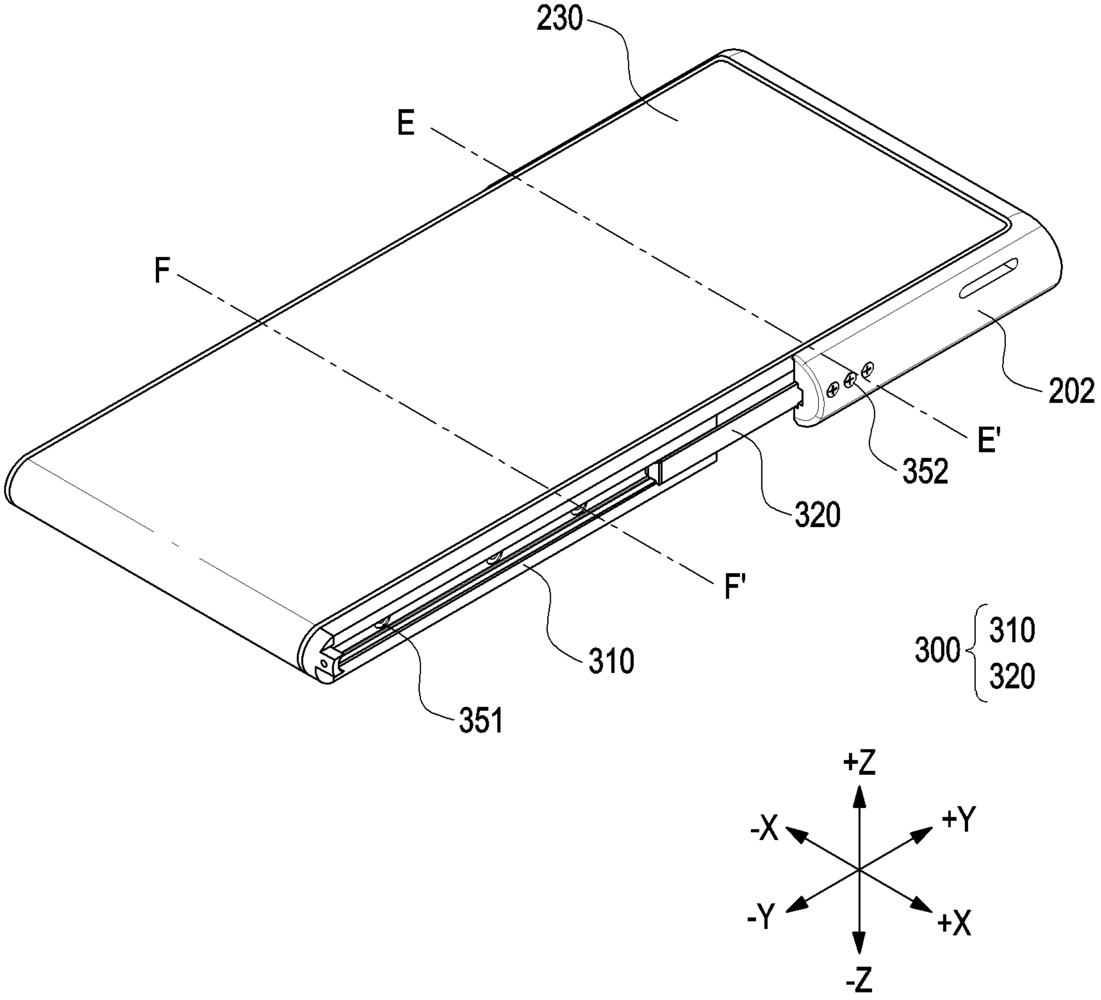
FIG. 20 is a view illustrating a guide assembly including a block cover according to an embodiment of the disclosure.

FIG. 20 is a view illustrating a guide assembly including a block cover according to an embodiment of the disclosure.

Figure 21:
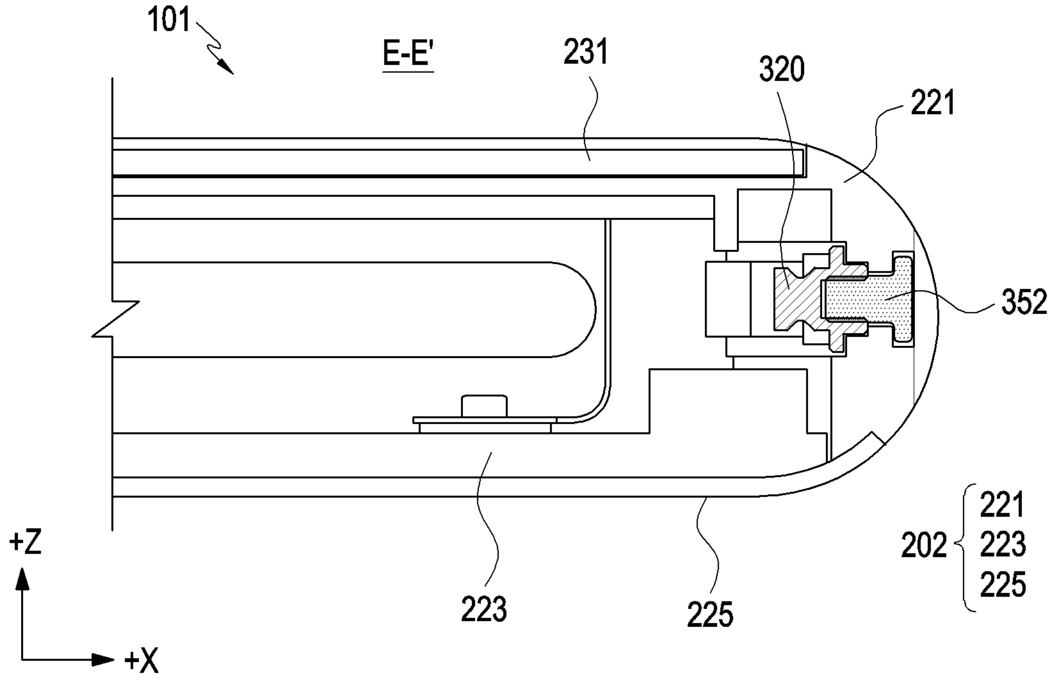
FIG. 21 is a rear perspective view illustrating a guide assembly including a block cover according to an embodiment of the disclosure.

FIG. 21 is a rear perspective view illustrating a guide assembly including a block cover according to an embodiment of the disclosure.

Referring to FIGS. 20 and 21, the guide assembly 300 may include a guide member 310, a rail structure 320, and a first block cover 341. The configuration of the guide member 310, the rail structure 320, and the first block cover 341 of FIGS. 20 and 21 may be identical in whole or part to the configuration of the guide member 310, the rail structure 320, and the first block cover 341 of FIG. 7.

According to various embodiments, the first block cover 341 may be connected to the guide member 310. For example, the first block cover 341 may be attached to the guide member 310. According to an embodiment, the first block cover 341 may include a body portion 3412 and at least one attaching portion 3411 protruding from the body portion 3412. The guide member 310 may include an attaching hole or an attaching recess formed in a first end portion (e.g., the first end portion 3101 of FIG. 7) of the guide member 310. The attaching portion 3411 of the first block cover 341 may be attached in a state of being inserted into the attaching hole or the attaching recess of the guide member 310, and thus the first block cover 341 may be attached to the guide member 310. According to an embodiment, the first block cover 341 may be attached to the guide member 310 at a plurality of points. For example, the attaching portion 3411 may protrude from a plurality of points spaced apart from each other. According to another embodiment, the first block cover 341 may be linearly attached to the guide member 310. For example, the attaching portion 3411 may be one extending protrusion. According to an embodiment, the first block cover 341 and/or the guide member 310 may include metal.

According to an embodiment, the first block cover 341 may surround at least a portion of the guide member 310. For example, the guide member 310 may include an insertion area 315 forming at least a portion of the first end portion 3101, and the first block cover 341 may include a receiving portion 3413 receiving the insertion area 315.

Figure 22:
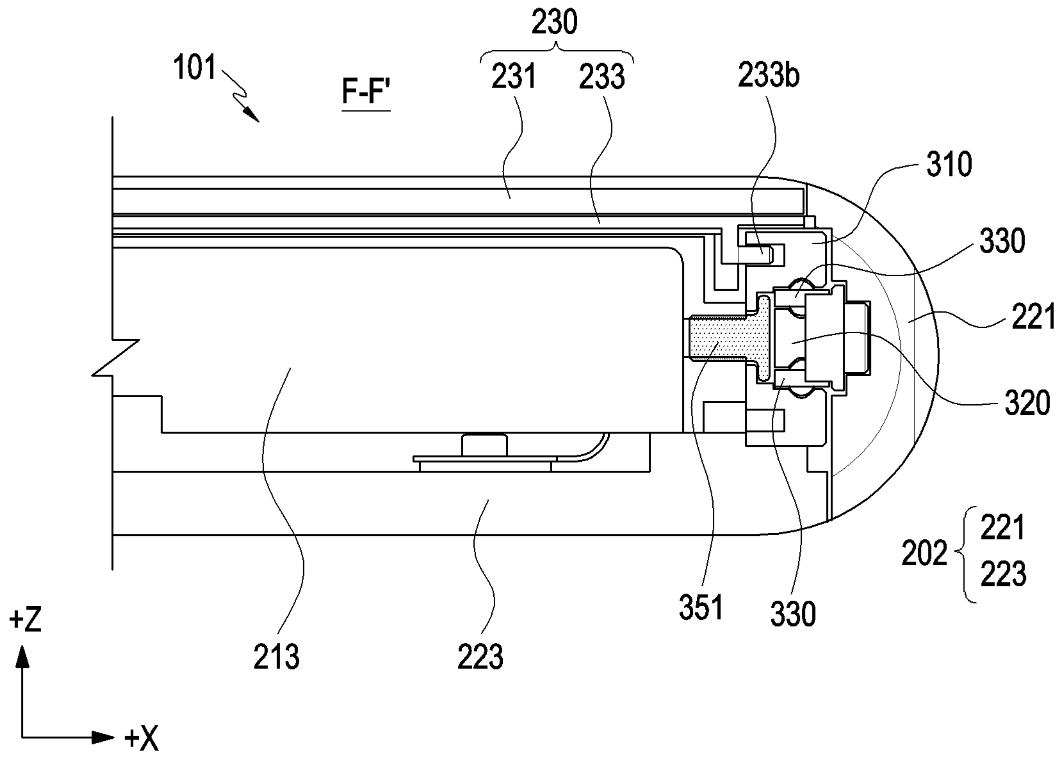
FIG. 22 is a cross-sectional view taken along line E-E' of FIG. 18 according to an embodiment of the disclosure.

FIG. 22 is a cross-sectional view taken along line E-E' of FIG. 18 according to an embodiment of the disclosure.

Figure 23:
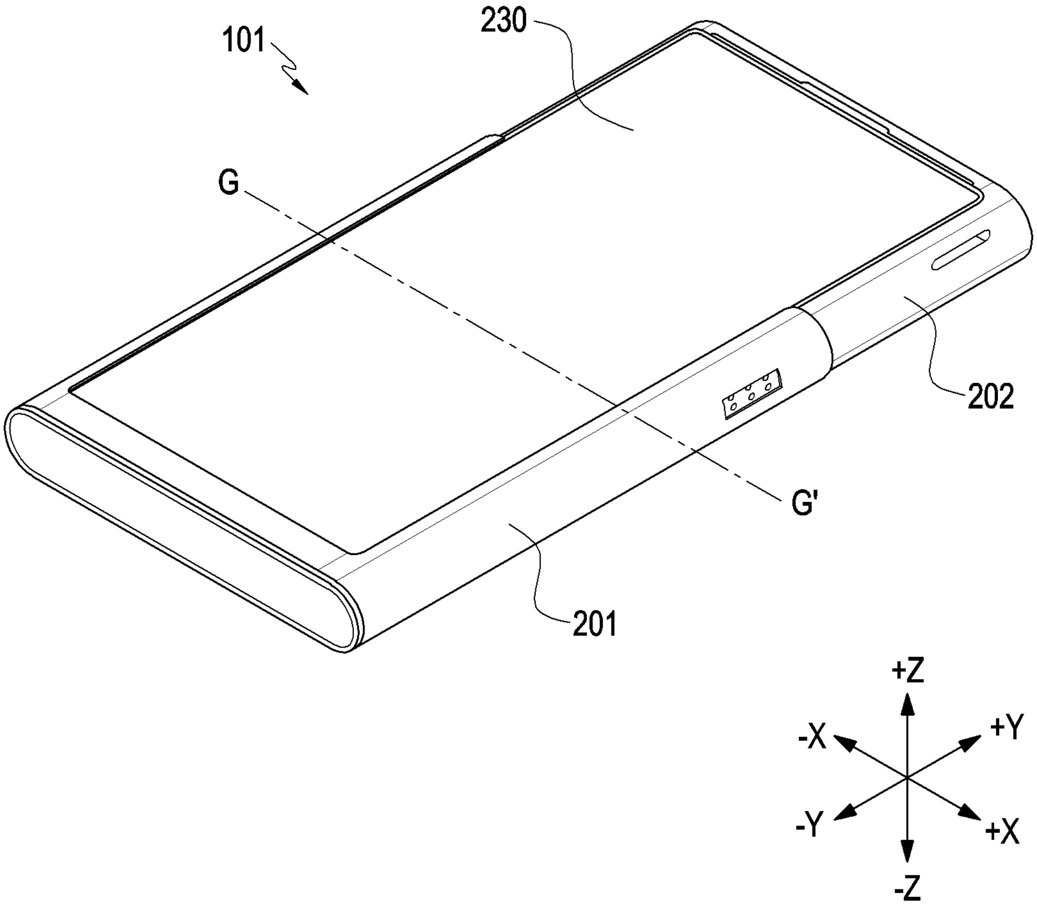
FIG. 23 is a perspective view illustrating an electronic device according to an embodiment of the disclosure.

FIG. 23 is a perspective view illustrating an electronic device according to an embodiment of the disclosure.

Figure 24:
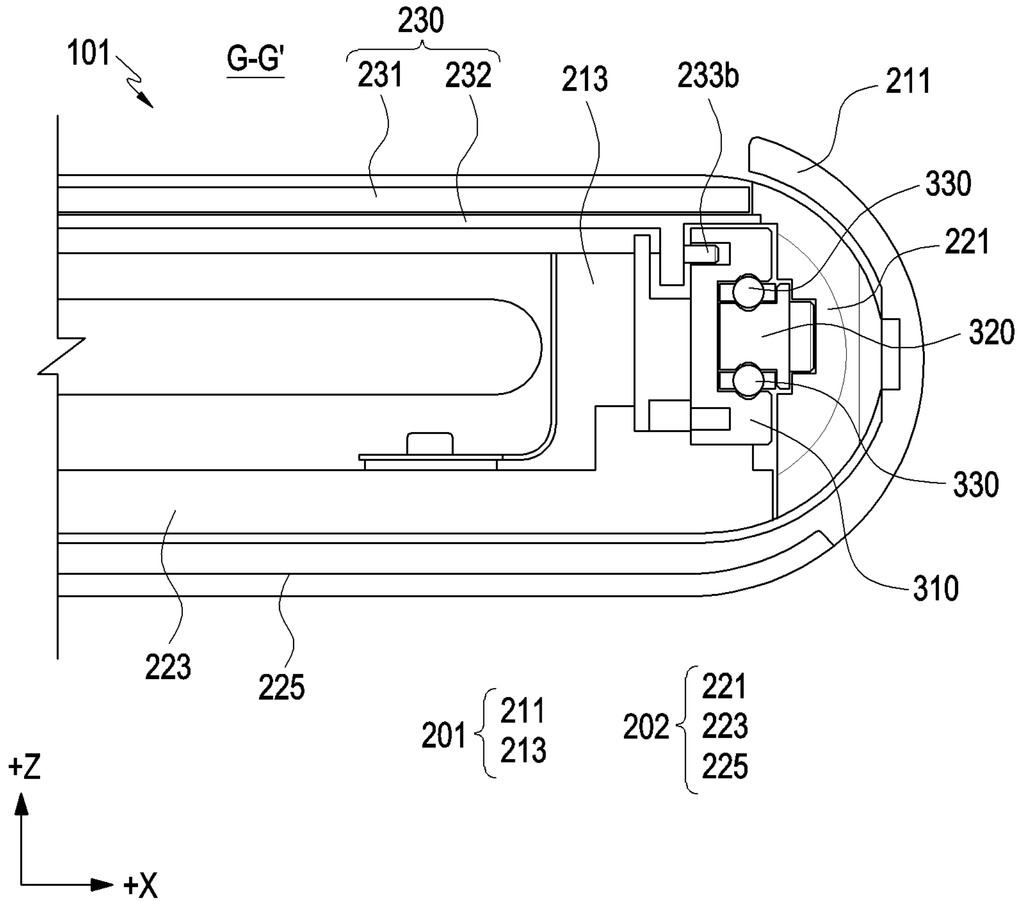
FIG. 24 is a cross-sectional view taken along line G-G' of FIG. 23 according to an embodiment of the disclosure.

FIG. 24 is a cross-sectional view taken along line G-G' of FIG. 23 according to an embodiment of the disclosure.

Referring to FIGS. 22, 23, and/or 24, an electronic device 101 may include a first housing 201, a second housing 202, a display assembly 230 (e.g., the display 231, the multi-bar structure 232, and the protruding area 233*b*), and a guide assembly 300 (e.g., the guide member 310, the rail structure 320, and the friction reducing structure 330). The configuration of the first housing, the second housing 202, the display assembly 230, and the guide assembly 300 of FIGS. 20 to 24 may be identical in whole or part to the configuration of the first housing, the second housing 202, the display assembly 230, and the guide assembly 300 of FIG. 4.

According to various embodiments, the guide assembly 300 may be connected to different housings. For example, the guide member 310 may be connected to the first housing 201, and the rail structure 320 may be connected to the second housing 202. According to an embodiment, the rail structure 320 may be coupled to the second cover member 221 using the second fastening member 352. The rail structure 320, together with the second housing 202 (e.g., the second cover member 221, the rear cover 223, and the second rear plate 225), may move relative to the first housing 201 (e.g., the first cover member 211 and the frame 213). The guide member 310, together with the first housing 201 (e.g., the first cover member 211 and the frame 213), may move relative to the second housing 202 (e.g., the second cover member 221, the rear cover 223, and the second rear plate 225).

According to another example (not illustrated), the guide member 310 may be connected to the second housing 202, and the rail structure 320 may be connected to the first housing 201. For example, the guide member 310 may be connected to the second cover member 221, and the rail structure 320 may be connected to the frame 213.

Figure 25:
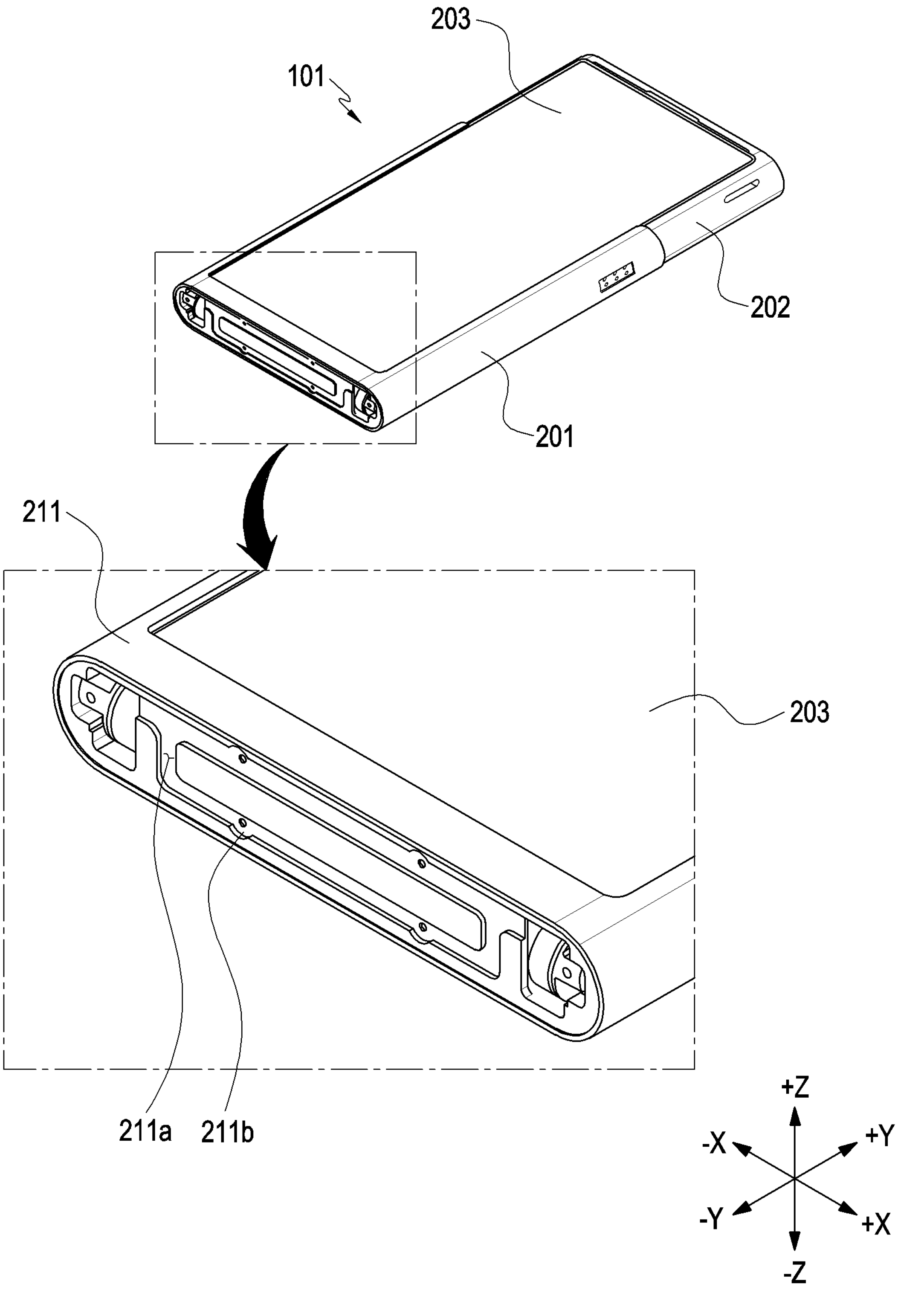
FIG. 25 is a perspective view illustrating an electronic device except for a guide bar and a protection member according to an embodiment of the disclosure.

FIG. 25 is a perspective view illustrating an electronic device except for a guide bar and a protection member according to an embodiment of the disclosure.

Figure 26:
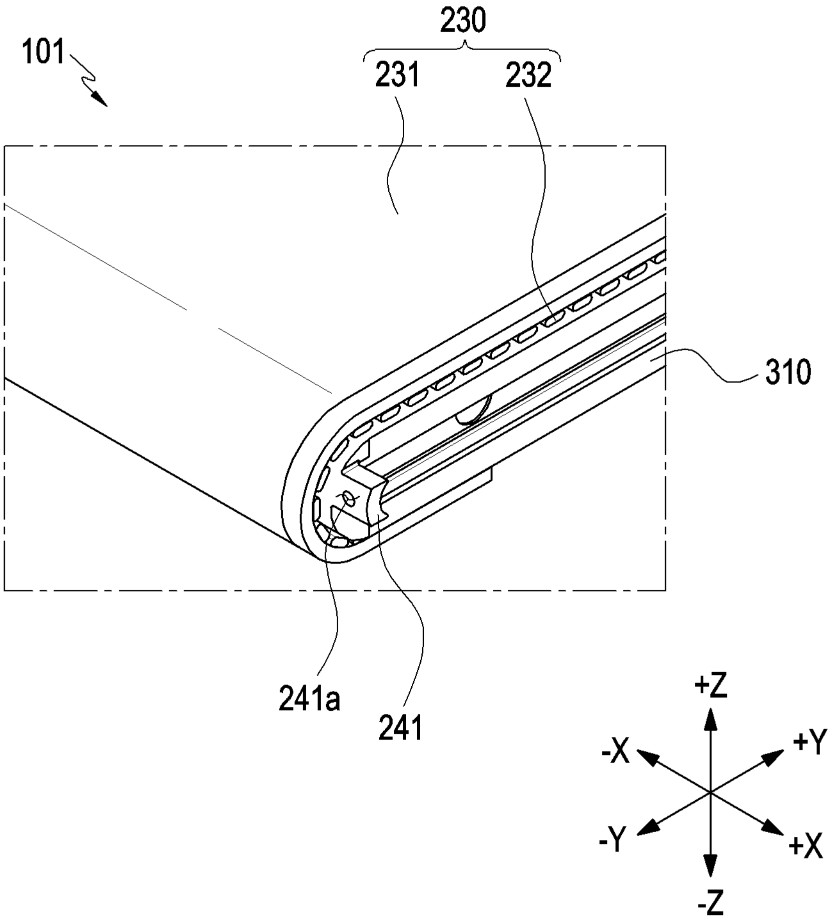
FIG. 26 is a perspective view illustrating an electronic device except for a guide bar, a protection member, and a first cover member according to an embodiment of the disclosure.

FIG. 26 is a perspective view illustrating an electronic device except for a guide bar, a protection member, and a first cover member according to an embodiment of the disclosure.

Figure 27:
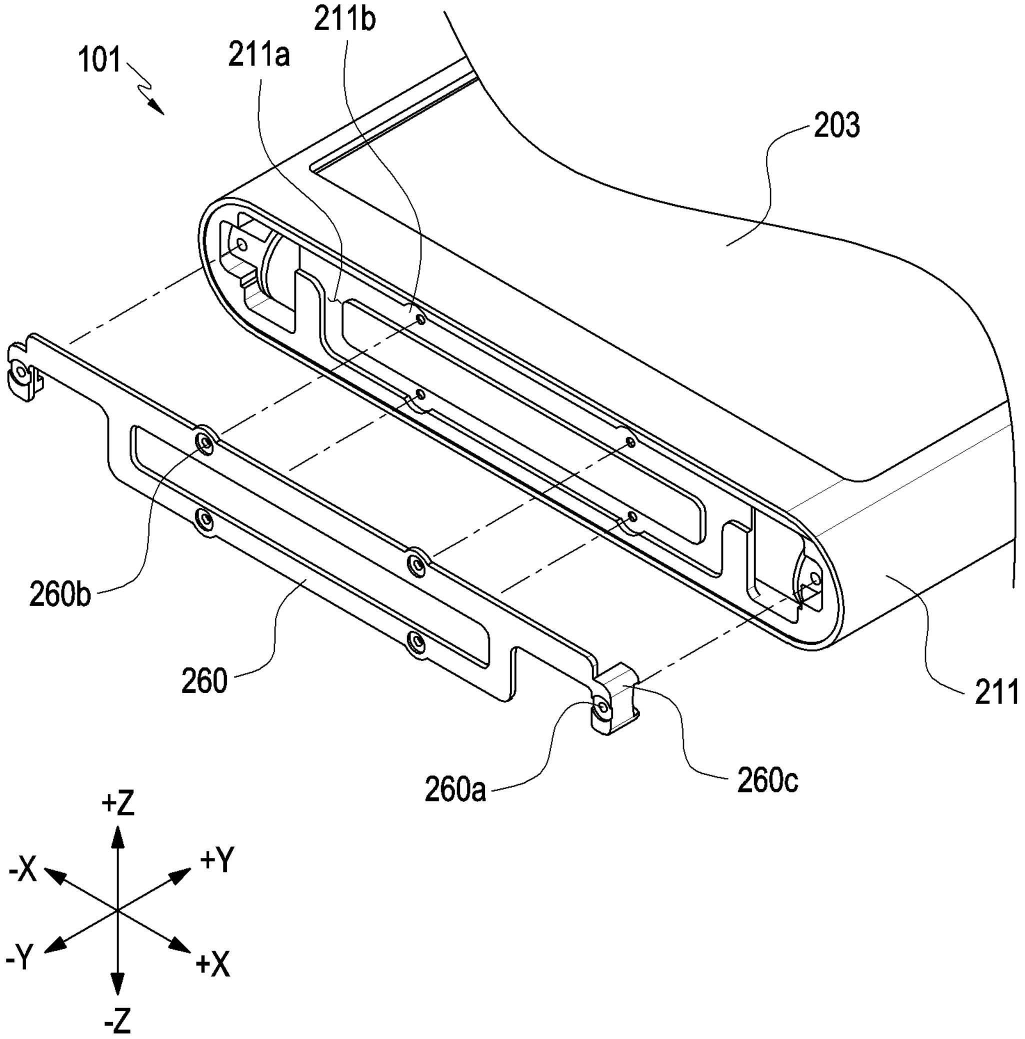
FIG. 27 is an exploded perspective view illustrating a first cover member and a guide bar according to an embodiment of the disclosure.

FIG. 27 is an exploded perspective view illustrating a first cover member and a guide bar according to an embodiment of the disclosure.

Figure 28:
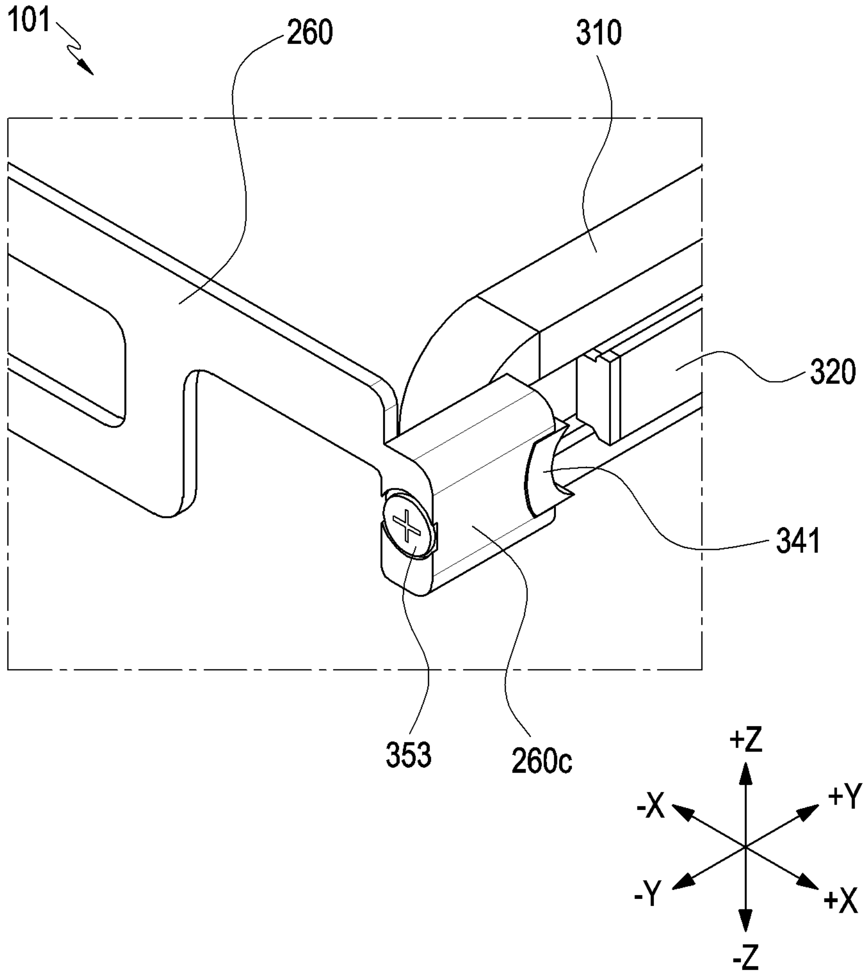
FIG. 28 is a perspective view illustrating a guide bar coupled to a guide assembly according to an embodiment of the disclosure.

FIG. 28 is a perspective view illustrating a guide bar coupled to a guide assembly according to an embodiment of the disclosure.

Figure 29A:
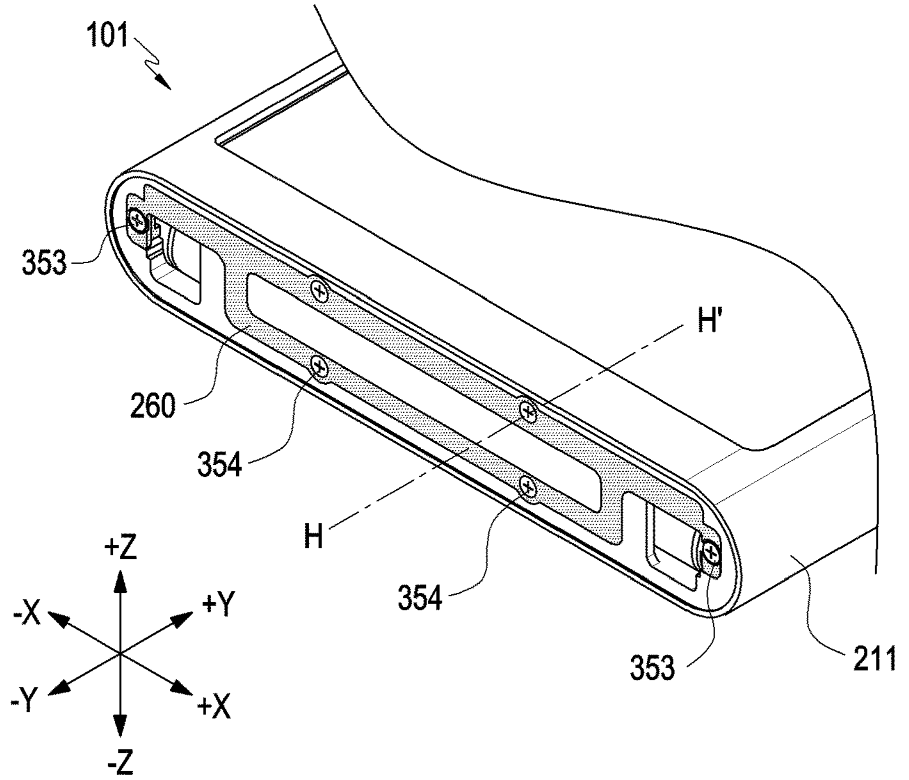
FIG. 29A is a perspective view illustrating an electronic device including a guide bar according to an embodiment of the disclosure.

FIG. 29A is a perspective view illustrating an electronic device including a guide bar according to an embodiment of the disclosure.

Figure 29B:
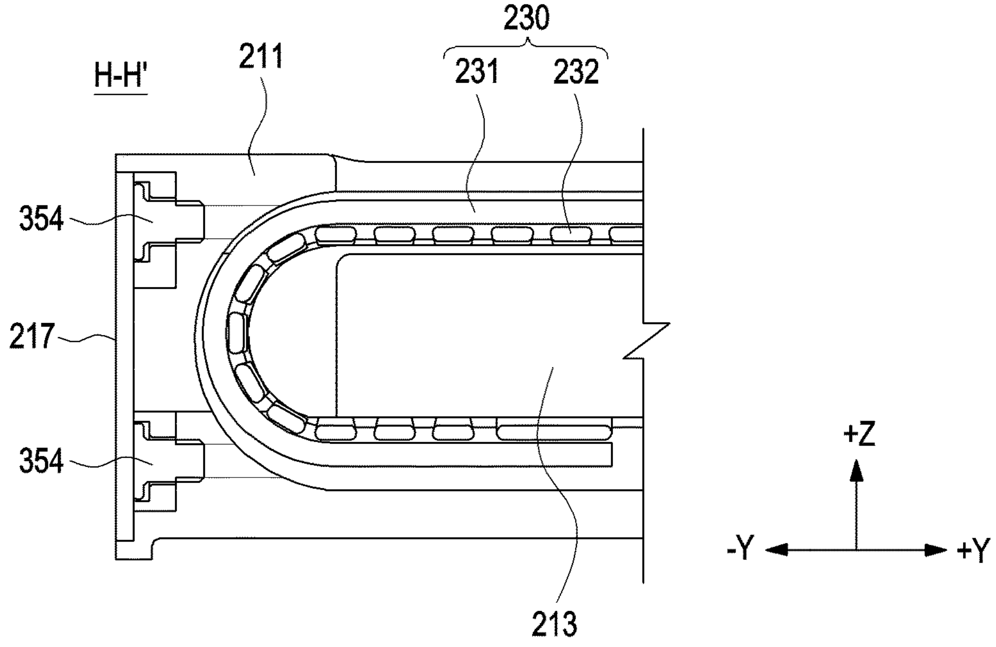
FIG. 29B is a cross-sectional view taken along line H-H' of FIG. 29A according to an embodiment of the disclosure.

FIG. 29B is a cross-sectional view taken along line H-H' of FIG. 29A according to an embodiment of the disclosure.

Referring to FIGS. 25, 26, 27, 28, 29A, and/or 29B, an electronic device 101 may include a first housing 201, a second housing 202, a display 203, a guide bar 260, and a guide assembly 300. The configuration of the first housing 201 (e.g., the first cover member 211, the frame 213, the protection member 217), the second housing 202, the display assembly 230 (e.g., the display 231 and the bar 233), and the guide assembly 300 (e.g., the guide member 310 and the rail structure 320) of FIGS. 25, 26, 27, 28, 29A, and/or 29B may be identical in whole or part to the configuration of the first housing 201, the second housing 202, the display assembly 230, and the guide assembly 300 of FIG. 4.

According to various embodiments, the first cover member 211 may include a guide bar receiving groove 211*a* for receiving the guide bar 260. The guide bar receiving groove 211*a* may be a groove formed in a shape corresponding to the shape of the guide bar 260. At least a portion of the guide bar 260 may be disposed in the guide bar receiving groove 211*a*. According to an embodiment, the first cover member 211 may include at least one third fastening hole 211*b* for connection with the guide bar 260. The third fastening hole 211*b* may be a through hole, a groove, or a recess formed in the guide bar receiving groove 211*a*. According to an embodiment, the guide bar 260 may be connected to the first cover member 211 using the at least one fourth fastening member 354 while being received in the guide bar receiving groove 211*a*. According to an embodiment, the number of the third fastening holes 211*b* may be variously changed based on a required coupling force.

According to various embodiments, the guide bar 260 may include a through hole to be connected to the first cover member 211 and/or the guide assembly 300. For example, the guide bar 260 may include an extension area 260*c* facing at least a portion of the first block cover 341, a fourth fastening hole 260*a* formed to correspond to the sixth fastening hole 241*a* of the first block cover 341, and at least one fifth fastening hole 260*b* formed to correspond to the third fastening hole 211*b* of the first cover member 211. According to an embodiment, the fourth fastening hole 241*a* may be a through hole formed in the extension area 260*c*.

According to various embodiments, the first block cover 341 may be connected to the guide bar 260. According to an embodiment, the first block cover 341 may face at least a portion (e.g., the extension area 260*c*) of the guide bar 260. According to an embodiment, the first block cover 341 may include a sixth fastening hole 241*a* to be connected to the guide bar 260.

According to various embodiments, the first cover member 211 may be connected to the guide assembly 300. For example, the first cover member 211 may be connected to the guide assembly 300 using the guide bar 260. According to an embodiment, the first cover member 211 may be connected to the guide bar 260. For example, the fourth fastening member 354 may be disposed in the fifth fastening hole 260*b* of the guide bar 260 and the third fastening hole 211*b* of the first cover member 211. The guide bar 260 may be connected to or fastened to the first cover member 211 by the fourth fastening member 354. According to an embodiment, the first block cover 341 may be connected to the guide bar 260. For example, the third fastening member 353 may be disposed in the fourth fastening hole 260*a* of the guide bar 260 and the sixth fastening hole 341*a* of the first block cover 341. The guide bar 260 may be connected to or fastened to the first block cover 341 by the third fastening member 353.

According to various embodiments, the protection member 217 may cover the guide bar 260. For example, the protection member 217 may cover the guide bar 260 and the first block cover 341. Since the guide bar 260 and the first block cover 341 are not visually exposed to the outside by the protection member 217, the aesthetics of the electronic device 101 may be enhanced. According to an embodiment, the protection member 217 may be connected to the first cover member 211.

Figure 30:
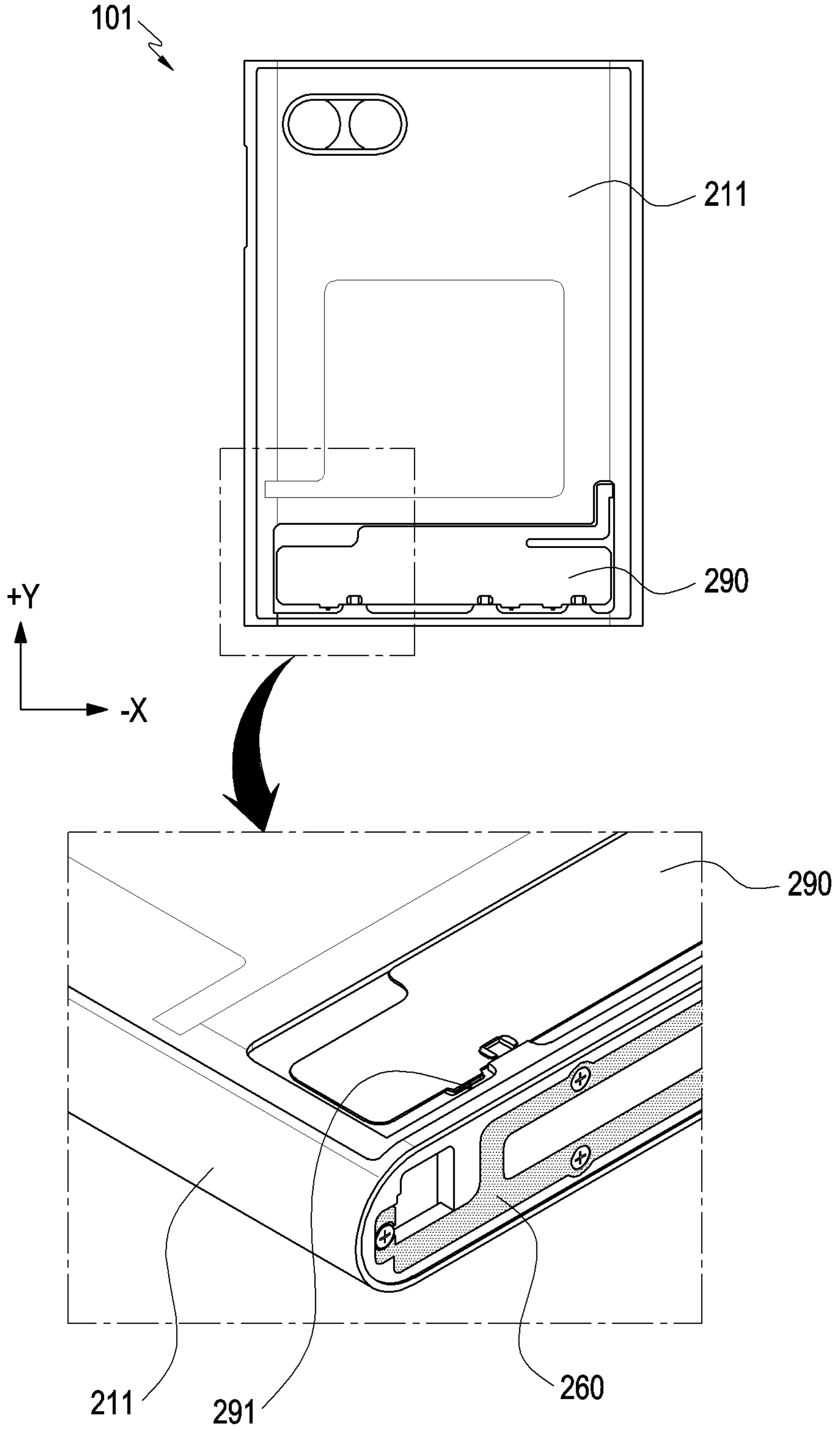
FIG. 30 is a view illustrating an electronic device including a second circuit board according to an embodiment of the disclosure.

FIG. 30 is a view illustrating an electronic device including a second circuit board according to an embodiment of the disclosure.

Figure 31:
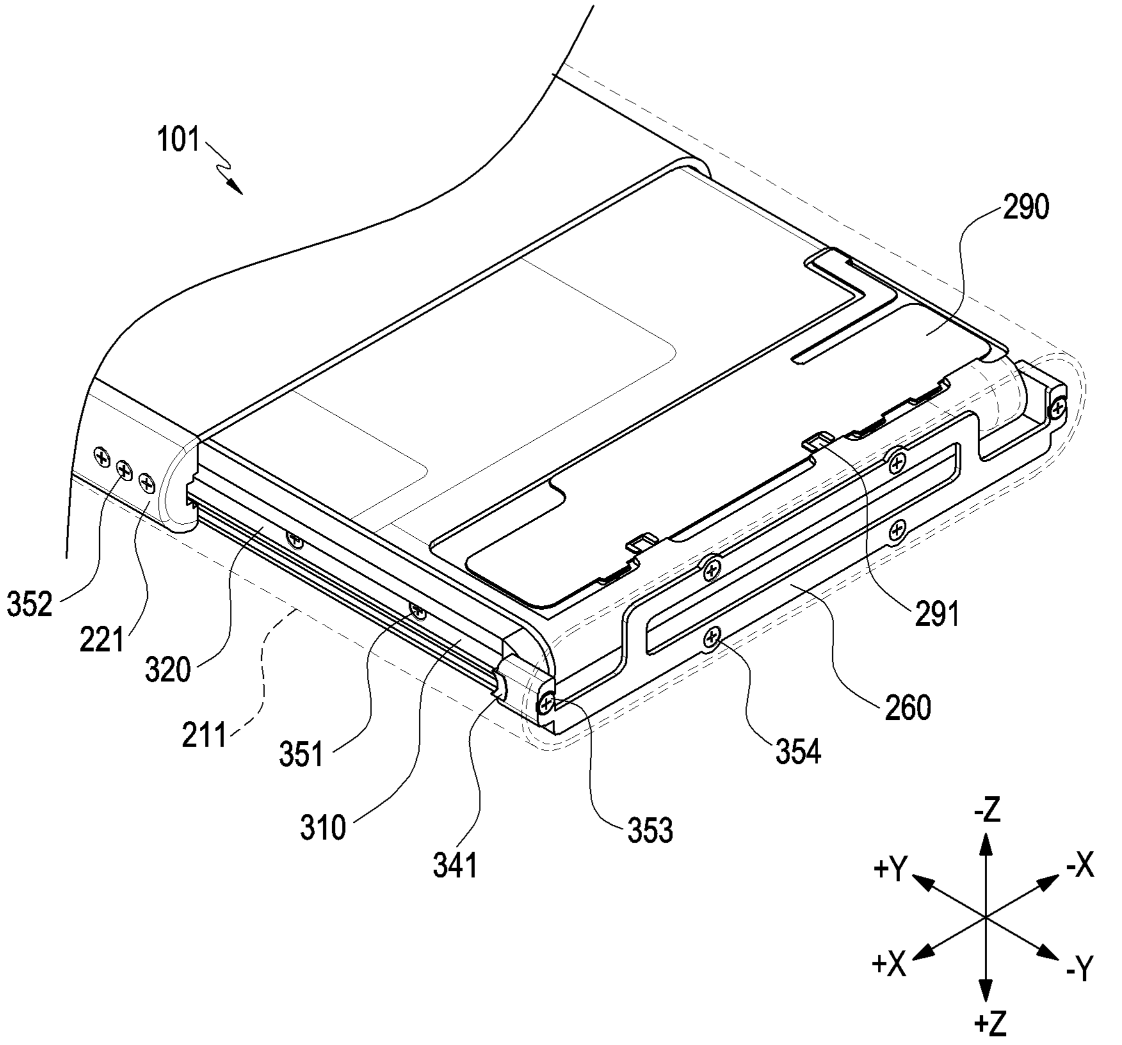
FIG. 31 is a see-through view illustrating an electronic device including a second circuit board according to an embodiment of the disclosure.

FIG. 31 is a see-through view illustrating an electronic device including a second circuit board according to an embodiment of the disclosure.

Referring to FIGS. 30 and 31, an electronic device 101 may include a first cover member 211, a second cover member 221, a guide bar 260, an antenna contact portion 291, a guide member 310, a rail structure 320, a first block cover 341, and fastening members 351, 352, 353, and 354. The configuration of the first cover member 211, the second cover member 221, the guide bar 260, the guide member 310, the rail structure 320, the first block cover 341, and the fastening members 351, 352, 353, and 354 of FIGS. 30 and 31 may be identical in whole or part to the configuration of the first cover member 211, the second cover member 221, the guide bar 260, the guide member 310, the rail structure 320, the first block cover 341, and the fastening members 351, 352, 353, and 354 of FIGS. 4, 7, and/or 29A.

According to various embodiments, the electronic device 101 may include a circuit board 290. According to an embodiment, the circuit board 290 may be disposed on the first cover member 211. According to an embodiment, the configuration of the circuit board 290 of FIGS. 30 and 31 may be identical in whole or part to the configuration of the second circuit board 252 of FIG. 4. According to an embodiment, at least one antenna may be connected to the circuit board 290 or may be disposed on the circuit board 290.

According to various embodiments, the guide bar 260 and/or the guide assembly 300 may enhance the performance of the antenna positioned on the circuit board 290. For example, as the ground area is increased by the guide bar 260 and/or the guide assembly 300, the parasitic resonance of the antenna may be reduced. According to an embodiment, the first housing (e.g., the first cover member 211) and/or the guide bar 260 may be electrically connected to the circuit board 290 using the antenna contact portion 291, and the second housing (e.g., the second cover member 221) may be electrically connected to the first housing (e.g., the first cover member 211) using the guide assembly 300. The first cover member 211 and/or the second cover member 221 may be used as a ground structure of the antenna disposed on the circuit board 290.

According to various embodiments of the disclosure, an electronic device (e.g., the electronic device 101 of FIG. 3) may comprise a first housing (e.g., the first housing 201 of FIG. 3), a second housing (e.g., the second housing 202 of FIG. 3) configured to slide relative to the first housing, a rollable display (e.g., the display 203 of FIG. 3) configured to be unrolled or rolled based on slide movement of the second housing, a multi-bar structure (e.g., the multi-bar structure 232 of FIG. 4) supporting the rollable display, and attached to at least a portion of the rollable display, and a guide assembly (e.g., the guide assembly 300 of FIG. 6B) configured to guide the slide movement of the second housing. The guide assembly may include a rail structure (e.g., the rail structure 320 of FIG. 6B) connected to the second housing and a rail receiving part (e.g., the guide member 310 of FIG. 6A) including a first surface (e.g., the first surface 310*a* of FIG. 6A), in which a first slit (e.g., the first slit 311 of FIG. 6A) receiving at least a portion of the multi-bar structure is formed, and a second surface (e.g., the second surface 310*b* of FIG. 6B) opposite to the first surface and receiving at least a portion of the rail structure. The rail structure may be configured to slide with respect to the rail receiving part.

According to various embodiments of the disclosure, an electronic device (e.g., the electronic device 101 of FIG. 3) may comprise a housing (e.g., the housing 210 of FIG. 3) including a first housing (e.g., the first housing 201 of FIG. 3) and a second housing (e.g., the second housing 202 of FIG. 3) at least partially received in the first housing and configured to relatively move with respect to the first housing, a display (e.g., the display 203 of FIG. 3) configured to be unrolled based on a slide of the second housing, a multi-bar structure (e.g., the multi-bar structure 232 of FIG. 4) supporting the display, and a guide assembly (e.g., the guide assembly 300 of FIG. 6B) for reducing friction of movement of the second housing with respect to the first housing and including a guide member (e.g., the guide member 310 of FIG. 6A) including a first surface (e.g., the first surface 310*a* of FIG. 6A) having a first slit (e.g., the first slit 311 of FIG. 6A) receiving at least a portion of the multi-bar structure and a second surface (e.g., the second surface 310*b* of FIG. 6B) opposite to the first surface and having a second slit (e.g., the first slit 312 of FIG. 6B) and a rail structure (e.g., the rail structure 320 of FIG. 6B) having at least a portion received in the second slit and configured to slide with respect to the guide member.

According to various embodiments, the guide assembly may include a friction reducing structure (e.g., the friction reducing structure 330 of FIG. 7) for reducing friction generated by a relative movement of the rail receiving part with respect to the rail structure. The friction reducing structure may include at least one ball (e.g., the ball 331 of FIG. 11) located between the rail receiving part and the rail structure.

According to various embodiments, the friction reducing structure may include a cage structure (e.g., the case structure 332 of FIG. 11) receiving the at least one ball.

According to various embodiments, the rail structure may include a third end portion (e.g., the third end portion 3201 of FIG. 7) and a fourth end portion (e.g., the fourth end portion 3202 of FIG. 7) opposite to the third end portion. The guide assembly may include a first rail cover (e.g., the first rail cover 343 of FIG. 7) connected to the third end portion and a second rail cover (e.g., the second rail cover 344 of FIG. 7) connected to the fourth end portion. The second rail cover may be configured to reduce escape of the friction reducing structure from the second slit.

According to various embodiments, the rail receiving part may include a first end portion (e.g., the first end portion 3101 of FIG. 7) and a second end portion (e.g., the second end portion 3102 of FIG. 7) opposite to the first end portion. The guide assembly may include a first block cover (e.g., the first block cover 341 of FIG. 7) connected to the first end portion and a second block cover (e.g., the second block cover 342 of FIG. 7) connected to the second end portion and configured to reduce escape of the rail structure from the rail receiving part.

According to various embodiments, the first housing may include a frame (e.g., the frame 213 of FIG. 4) connected to the rail receiving part and a first cover member (e.g., the first cover member 211 of FIG. 4) connected to the first block cover and surrounding at least a portion of the frame and the rail receiving part.

According to various embodiments, the first housing may include a guide bar (e.g., the guide bar 260 of FIG. 4) connected to the first block cover and the first cover member.

According to various embodiments, the first housing may include a protection member (e.g., the protection member 217 of FIG. 4) connected to the first cover member and covering the guide bar and the first block cover.

According to various embodiments, the electronic device may further comprise at least one first fastening member (e.g., the first fastening member 351 of FIG. 18) connecting the first housing and the guide member.

According to various embodiments, the electronic device may further comprise at least one second fastening member (e.g., the second fastening member 352 of FIG. 18) connecting the second housing and the rail structure.

According to various embodiments, the electronic device may further comprise a circuit board (e.g., the circuit board 290 of FIG. 30) disposed on the first housing and connected to an antenna. The second housing may be electrically connected to the first housing and the circuit board through the guide assembly.

According to various embodiments, the first slit may include a first groove area (e.g., the first groove area 311*a* of FIG. 8B) formed along a sliding direction (e.g., the Y-axis direction of FIG. 12) of the housing and a second groove area (e.g., the second groove area 311*b* of FIG. 8B) extending from the first groove area, wherein at least a portion of which is bent. The second slit may be formed along the sliding direction (e.g., the Y-axis direction of FIG. 3).

According to various embodiments, the display may include a first display area (e.g., the first display area A1 of FIG. 3) disposed on the second housing and a second display area (e.g., the second display area A2 of FIG. 3) extending from the first display area, wherein at least a portion of which is configured to be rolled.

According to various embodiments, the multi-bar structure may include a supporting area (e.g., the supporting area 233*a* of FIG. 13) supporting the display and a protruding area (e.g., the protruding area 233*b* of FIG. 13) protruding from the supporting area. The protruding area may be configured to slide along the first slit.

According to various embodiments, the electronic device may further comprise a driving structure (e.g., the driving structure 240 of FIG. 4) disposed in the housing and configured to move the second housing with respect to the first housing. The driving structure may include a motor (e.g., the motor 241 of FIG. 4) configured to generate a driving force for a slide movement of the housing, a gear connected to the motor, and a rack (e.g., the rack 242 of FIG. 4) configured to be engaged with the gear.

According to various embodiments of the disclosure, an electronic device (e.g., the electronic device 101 of FIG. 3) may comprise a first housing (e.g., the first housing 201 of FIG. 3), a second housing (e.g., the second housing 202 of FIG. 3) at least partially received in the first housing and configured to relatively move with respect to the first housing, a display (e.g., the display 203 of FIG. 3) configured to be unrolled based on the movement of the second housing, a multi-bar structure (e.g., the multi-bar structure 232 of FIG. 4) supporting the display, and a guide assembly (e.g., the guide assembly 300 of FIG. 7) including a guide member (e.g., the guide member 310 of FIG. 7) connected to the first housing and a rail structure (e.g., the rail structure 320 of FIG. 7) connected to the second housing. The guide member may include a first surface (e.g., the first surface 310*a* of FIG. 7) where a first slit (e.g., the first slit 311 of FIG. 7) for guiding a movement of the multi-bar structure is positioned and a second surface (e.g., the second surface 312 of FIG. 7) where a second slit (e.g., the second slit 312 of FIG. 7) for guiding movement of the rail structure is positioned, and opposite to the first surface.

According to various embodiments, the guide assembly may include a friction reducing structure (e.g., the friction reducing structure 330 of FIG. 7) for reducing friction generated by a relative movement of the rail receiving part with respect to the rail structure. The friction reducing structure may include at least one ball and a cage structure (e.g., the cage structure 332 of FIG. 10A) receiving the at least one ball (e.g., the ball 331 of FIG. 10A) and disposed between the guide member and the rail structure.

According to various embodiments, the rail receiving part may include a first end portion (e.g., the first end portion 3101 of FIG. 7) and a second end portion (e.g., the second end portion 3102 of FIG. 7) opposite to the first end portion. The guide assembly may include a first block cover (e.g., the first block cover 341 of FIG. 7) connected to the first end portion and a second block cover (e.g., the second block cover 342 of FIG. 7) connected to the second end portion and configured to reduce escape of the rail structure from the rail receiving part. The first housing may include a frame (e.g., the frame 213 of FIG. 4) connected to the guide member and a first cover member (e.g., the first cover member 211 of FIG. 4) connected to the first block cover and surrounding the frame and at least a portion of the guide member.

According to various embodiments, the electronic device may further comprise a circuit board (e.g., the circuit board 290 of FIG. 30) disposed on the first housing and connected to an antenna. The second housing may be configured to be electrically connected to the first housing and the circuit board through the guide assembly.

According to various embodiments, the first slit may include a first groove area (e.g., the first groove area 311*a* of FIG. 8B) formed along a sliding direction of the housing and a second groove area (e.g., the second groove area 311*b* of FIG. 8B) extending from the first groove area and having at least a bent portion. The second slit may be formed along the sliding direction.

According to various embodiments of the disclosure, an electronic device may comprise a first housing (e.g., the first housing 201 of FIG. 4) including a frame (e.g., the frame 213 of FIG. 4) receiving a battery (e.g., the battery 289 of FIG. 4) and a first cover member (e.g., the first cover member 211 of FIG. 4) surrounding at least a portion of the frame, a second housing (e.g., the second housing 202 of FIG. 4) including a second cover member (e.g., the second cover member 221 of FIG. 4) receiving a circuit board (e.g., the first circuit board 251 of FIG. 4) and configured to slide with respect to the first housing, a display (e.g., the display 231 of FIG. 4) configured to be at least partially unrolled based on the slide of the second housing and including a first display area (e.g., the first display area A1 of FIG. 4) disposed on the second cover member and a second display area (e.g., the second display area A2 of FIG. 4) extending from the first display area and configured to move along the frame, a multi-bar structure (e.g., the multi-bar structure 232 of FIG. 4) supporting at least a portion of the display, and a guide assembly (e.g., the guide assembly 300 of FIG. 7) including a guide member (e.g., the guide member 310 of FIG. 7) for sliding the multi-bar structure and a rail structure (e.g., the rail structure 320 of FIG. 7) for sliding the second housing. The guide member may be connected to the frame, and the rail structure may be connected to the second cover member and may be configured to slide with respect to the guide member while being at least partially received in the guide member.

According to various embodiments, the guide assembly may include a friction reducing structure (e.g., the friction reducing structure 330 of FIG. 7) configured to reduce frictional force generated from a relative movement of the guide member with respect to the rail structure and including at least one ball (e.g., the ball 331 of FIG. 10A) positioned between the guide member and the rail structure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device, comprising:
- a first housing;
- a second housing configured to linearly move relative to the first housing;
- a flexible display including a first display area, and a second display area extending from the first display area;
- a multi-bar structure configured to support the flexible display, and attached to at least a portion of the flexible display, wherein the second display area of the flexible display is unrolled or rolled using the multi-bar structure based on a linear movement of the second housing; and
- a guide assembly configured to guide the linear movement of the second housing,
- wherein the guide assembly includes:
  - a rail receiving part connected to the first housing, and
  - a rail structure connected to the second housing and configured to slide relative to the rail receiving part for the linear movement of the second housing,
- wherein the rail receiving part includes:
  - a first surface, on which a first slit is formed, the first slit receiving at least a portion of the multi-bar structure, wherein the at least a portion of the multi-bar structure is configured to slide along and within the first slit, and
  - a second surface opposite to the first surface, wherein a second slit receiving at least a portion of the rail structure is formed on the second surface and the at least a portion of the rail structure is configured to slide along and within the second slit,
- wherein the first slit comprises a first section and a second section extending along a linearly moving direction of the second housing, and
- wherein the second slit is positioned between the first section and the second section of the first slit and overlaps the first section and the second section of the first slit in a first direction.

2. The electronic device of claim 1,
- wherein the guide assembly includes a friction reducing structure for reducing friction generated by a relative movement of the rail receiving part with respect to the rail structure, and
- wherein the friction reducing structure includes at least one ball located between the rail receiving part and the rail structure.

3. The electronic device of claim 1, wherein the rail structure is substantially disposed within the rail receiving part and no portion of the rail receiving part is disposed within the rail structure.

4. The electronic device of claim 2,
- wherein the rail structure includes a third end portion and a fourth end portion opposite to the third end portion,
- wherein the guide assembly includes a first rail cover connected to the third end portion and a second rail cover connected to the fourth end portion, and
- wherein the second rail cover is configured to reduce escape of the friction reducing structure from the second slit.

5. The electronic device of claim 1,
- wherein the rail receiving part includes a first end portion and a second end portion opposite to the first end portion, and
- wherein the guide assembly includes a first block cover connected to the first end portion and a second block cover connected to the second end portion and configured to reduce escape of the rail structure from the rail receiving part.

6. The electronic device of claim 5, wherein the first housing includes a frame connected to the rail receiving part and a first cover member connected to the first block cover and surrounding at least a portion of the frame and the rail receiving part.

7. The electronic device of claim 6, wherein the first housing includes a guide bar connected to the first block cover and the first cover member.

8. The electronic device of claim 7, wherein the first housing includes a protection member connected to the first cover member and covering the guide bar and the first block cover.

9. The electronic device of claim 1, further comprising:
- at least one first fastening member connecting the first housing and the rail receiving part.

10. The electronic device of claim 1, further comprising:
- at least one second fastening member connecting the second housing and the rail structure.

11. The electronic device of claim 1, further comprising:
- a circuit board disposed on the first housing and connected to an antenna,
- wherein the second housing is electrically connected to the first housing and the circuit board through the guide assembly.

12. The electronic device of claim 1,
- wherein the first slit comprises a bent section connecting the first section and the second section.

13. The electronic device of claim 1,
- wherein the first display area is disposed on the second housing.

14. The electronic device of claim 1,
- wherein the multi-bar structure includes a supporting area supporting the display and a protruding area protruding from the supporting area, and
- wherein the protruding area is configured to slide along the first slit.

15. The electronic device of claim 1, further comprising:

a driving structure disposed in the first housing and configured to move the second housing with respect to the first housing, wherein the driving structure includes:

a motor configured to generate a driving force for a slide movement of the second housing, a gear connected to the motor, and a rack configured to be engaged with the gear.

* * * * *